(12) United States Patent
Kashiwagi et al.

(10) Patent No.: US 9,678,121 B2
(45) Date of Patent: Jun. 13, 2017

(54) POWER DISTRIBUTION MANAGEMENT APPARATUS, DISPLAY CONTROL METHOD, AND RECORDING MEDIUM

(71) Applicant: FUJITSU LIMITED, Kawasaki-shi, Kanagawa (JP)

(72) Inventors: Tetsuya Kashiwagi, Fukuoka (JP); Yuichi Matsufuji, Fukuoka (JP)

(73) Assignee: FUJITSU LIMITED, Kawasaki (JP)

( * ) Notice: Subject to any disclaimer, the term of this patent is extended or adjusted under 35 U.S.C. 154(b) by 141 days.

(21) Appl. No.: 14/674,374

(22) Filed: Mar. 31, 2015

(65) Prior Publication Data

US 2015/0212124 A1 Jul. 30, 2015

Related U.S. Application Data

(63) Continuation of application No. PCT/JP2012/075440, filed on Oct. 1, 2012.

(51) Int. Cl.

| | | |
|---|---|---|
| *G01R 21/06* | (2006.01) | |
| *H02J 13/00* | (2006.01) | |
| *G01R 19/165* | (2006.01) | |
| *G01R 19/25* | (2006.01) | |

(Continued)

(52) U.S. Cl.
CPC ........... *G01R 21/06* (2013.01); *G01R 19/165* (2013.01); *G01R 19/2513* (2013.01); *H02J 13/001* (2013.01); *G01R 21/133* (2013.01); *G01R 31/40* (2013.01); *Y04S 10/40* (2013.01)

(58) Field of Classification Search
CPC combination set(s) only.
See application file for complete search history.

(56) References Cited

U.S. PATENT DOCUMENTS

| | | | |
|---|---|---|---|
| 4,728,898 A * | 3/1988 | Staley, Jr. | G01R 19/16571 324/133 |
| 2008/0228518 A1 | 9/2008 | Braziel et al. | |

(Continued)

FOREIGN PATENT DOCUMENTS

| | | |
|---|---|---|
| JP | S55-144732 A | 11/1980 |
| JP | H03-198623 A | 8/1991 |
| JP | H10-187827 A | 7/1998 |

(Continued)

OTHER PUBLICATIONS

Extended European Search Report dated Oct. 5, 2015 for corresponding European Patent Application No. 12885993.1, 6 pages.

(Continued)

*Primary Examiner* — Clayton E Laballe
*Assistant Examiner* — Jas Sanghera
(74) *Attorney, Agent, or Firm* — Fujitsu Patent Center

(57) ABSTRACT

A power distribution management apparatus (10) includes acquiring a measurement result from a meter connected to a customer's load facility which receives a distributed power from a power distribution system, and using different display representation to display a facility where electricity flows from the load facility toward the facility of the power distribution system among facilities of the power distribution system to be distinguished from a facility where electricity flows from the facility of the power distribution system toward the load facility utilizing the measurement result of the meter.

15 Claims, 25 Drawing Sheets

(51) Int. Cl.
　　　*G01R 31/40*　　　(2014.01)
　　　*G01R 21/133*　　　(2006.01)

(56) References Cited

U.S. PATENT DOCUMENTS

2009/0281886 A1\*　11/2009　Castelli ................. G01D 4/004
　　　　　　　　　　　　　　　　　　　　　　　　　　705/14.17
2010/0305795 A1　　12/2010　Kuang et al.

FOREIGN PATENT DOCUMENTS

| JP | 2008-118799 A |  | 5/2008 |
|---|---|---|---|
| JP | 2012-005210 A |  | 1/2012 |
| JP | 2012-053821 A |  | 3/2012 |
| JP | 2012-060800 |  | 3/2012 |
| JP | 2012-90483 A |  | 5/2012 |
| JP | 2012-105463 A |  | 5/2012 |
| JP | 2012090483 A | \* | 5/2012 |
| JP | 2012-147578 A |  | 8/2012 |

OTHER PUBLICATIONS

International Search Report, mailed in connection with PCT/2012/075440 and mailed Dec. 11, 2012 (12 pages).
Viet Nga, Dao et al., "Visualization Techniques in Smart Grid," Smart Grid and Renewable Energy, vol. 3, No. 3, Jan. 1, 2012, pp. 175-185, XP055357216.
European Office Action mailed Apr. 4, 2017 for corresponding European Patent Application No. 12885993.1, 5 pages.

\* cited by examiner

FIG.4

| POSITION ID | POSITION TYPE | LONGITUDE | LATITUDE |
|---|---|---|---|
| SS0001 | SS | 502723016 | 128084866 |
| PO0001 | POLE | 502723021 | 128084176 |
| PO0002 | POLE | 502723031 | 128083227 |
| PO0003 | POLE | 502724066 | 128083262 |
| PO0004 | POLE | 502725091 | 128083296 |
| PO0005 | POLE | 502726033 | 128083331 |
| PO0006 | POLE | 502726840 | 128083382 |
| PO0007 | POLE | 502727844 | 128083430 |
| PO0008 | POLE | 502728620 | 128083503 |
| LL0001 | LOADL | 502728677 | 128083736 |
| PO0009 | POLE | 502729231 | 128083641 |
| PO0010 | POLE | 502729304 | 128084383 |
| PO0011 | POLE | 502729179 | 128084814 |
| LL0002 | LOADL | 502729402 | 128085012 |
| PO0012 | POLE | 502728879 | 128085361 |
| PO0013 | POLE | 502728620 | 128085900 |
| LL0003 | LOADL | 502729298 | 128086064 |
| LL0004 | LOADL | 502729174 | 128086288 |
| LL0005 | LOADL | 502729133 | 128085547 |
| PO0014 | POLE | 502725019 | 128082520 |
| LL0006 | LOADL | 502724661 | 128082339 |
| PO0015 | POLE | 502725112 | 128081757 |
| PO0016 | POLE | 502725122 | 128081244 |
| LL0007 | LOADL | 502724765 | 128081321 |
| LL0008 | LOADL | 502724744 | 128081718 |

| FACILITY ID | POSITION ID | TYPE | ATTRIBUTE INFORMATION |
|---|---|---|---|
| PO0001 P1 | PO0001 | POLE | ... |
| PO0001 01 | PO0001 | SW | ... |
| PO0002 P1 | PO0002 | POLE | ... |
| PO0003 P1 | PO0003 | POLE | ... |
| PO0004 P1 | PO0004 | POLE | ... |
| PO0004 01 | PO0004 | SW | ... |
| PO0005 P1 | PO0005 | POLE | ... |
| PO0006 P1 | PO0006 | POLE | ... |
| PO0007 P1 | PO0007 | POLE | ... |
| PO0007 01 | PO0007 | BANK | RESISTANCE (36800Ω), REACTANCE (31300Ω), VOLTAGE RATIO 1 |
| PO0008 P1 | PO0008 | POLE | ... |
| LL0001 01 | LL0001 | LOADL | ... |
| PO0009 P1 | PO0009 | POLE | ... |
| PO0009 01 | PO0009 | SW | ... |
| PO0010 P1 | PO0010 | POLE | ... |
| PO0011 P1 | PO0011 | POLE | ... |
| LL0002 01 | LL0002 | LOADL | ... |
| PO0012 P1 | PO0012 | POLE | ... |
| PO0012 01 | PO0012 | BANK | RESISTANCE (36800Ω), REACTANCE (31300Ω), VOLTAGE RATIO 2 |
| PO0013 P1 | PO0013 | POLE | ... |
| LL0003 01 | LL0003 | LOADL | ... |
| LL0004 01 | LL0004 | LOADL | ... |
| LL0005 01 | LL0005 | LOADL | ... |
| PO0014 P1 | PO0014 | POLE | ... |
| LL0006 01 | LL0006 | LOADL | ... |
| PO0015 P1 | PO0015 | POLE | ... |
| PO0015 01 | PO0015 | BANK | RESISTANCE (36800Ω), REACTANCE (31300Ω), VOLTAGE RATIO 3 |
| PO0016 P1 | PO0016 | POLE | ... |
| LL0007 01 | LL0007 | LOADL | ... |
| LL0008 01 | LL0008 | LOADL | ... |

FIG.6

| FACILITY ID | POSITION ID₁ | POSITION ID₂ | TYPE | ATTRIBUTE INFORMATION | | |
|---|---|---|---|---|---|---|
| | | | | SPAN SIZE | RESIST-ANCE (R) | REACTANCE (X) |
| SP0001 | SS0001 | PO0001 | 3H | 21 | 220 | 150 |
| SP0002 | PO0001 | PO0002 | 3H | 29 | 220 | 150 |
| SP0003 | PO0002 | PO0003 | 3H | 32 | 220 | 150 |
| SP0004 | PO0003 | PO0004 | 3H | 32 | 220 | 150 |
| SP0005 | PO0004 | PO0005 | 3H | 29 | 220 | 150 |
| SP0006 | PO0005 | PO0006 | 3H | 25 | 220 | 150 |
| SP0007 | PO0006 | PO0007 | 3H | 31 | 220 | 150 |
| SP0008 | PO0007 | PO0008 | 3H | 24 | 220 | 150 |
| SP0009 | PO0007 | PO0008 | 3L | 24 | 390 | 240 |
| SP0010 | PO0008 | LL0001 | | 7 | 510 | 820 |
| SP0011 | PO0008 | PO0009 | 3H | 19 | 220 | 150 |
| SP0012 | PO0009 | PO0010 | 3H | 23 | 220 | 150 |
| SP0013 | PO0010 | PO0011 | 3H | 14 | 220 | 150 |
| SP0014 | PO0012 | PO0011 | 3L | 19 | 390 | 240 |
| SP0015 | PO0011 | LL0002 | | 9 | 510 | 820 |
| SP0016 | PO0011 | PO0012 | 3H | 19 | 220 | 150 |
| SP0017 | PO0012 | PO0013 | 3L | 18 | 390 | 240 |
| SP0018 | PO0013 | LL0003 | | 22 | 510 | 820 |
| SP0019 | PO0013 | LL0004 | | 21 | 510 | 820 |
| SP0020 | PO0012 | LL0005 | | 10 | 510 | 820 |
| SP0021 | PO0004 | PO0014 | 3H | 24 | 220 | 150 |
| SP0022 | PO0015 | PO0014 | 3L | 24 | 390 | 240 |
| SP0023 | PO0014 | LL0006 | | 12 | 510 | 820 |
| SP0024 | PO0014 | PO0015 | 3H | 24 | 220 | 150 |
| SP0025 | PO0015 | PO0016 | 3L | 16 | 390 | 240 |
| SP0026 | PO0016 | LL0007 | | 11 | 510 | 820 |
| SP0027 | PO0015 | LL0008 | | 11 | 510 | 820 |

FIG.7

| NODE ID | POSI-TION ID |
|---|---|
| SS0001 N01 | SS0001 |
| PO0001 N01 | PO0001 |
| PO0001 N02 | PO0001 |
| PO0002 N01 | PO0002 |
| PO0003 N01 | PO0003 |
| PO0004 N01 | PO0004 |
| PO0004 N02 | PO0004 |
| PO0005 N01 | PO0005 |
| PO0006 N01 | PO0006 |
| PO0007 N01 | PO0007 |
| PO0007 N02 | PO0007 |
| PO0008 N01 | PO0008 |
| PO0008 N02 | PO0008 |
| LL0001 N01 | LL0001 |
| PO0009 N01 | PO0009 |
| PO0009 N02 | PO0009 |
| PO0010 N01 | PO0010 |
| PO0011 N01 | PO0011 |
| PO0011 N02 | PO0011 |
| LL0002 N01 | LL0002 |
| PO0012 N01 | PO0012 |
| PO0012 N02 | PO0012 |
| PO0013 N01 | PO0013 |
| LL0003 N01 | LL0003 |
| LL0004 N01 | LL0004 |
| LL0005 N01 | LL0005 |
| PO0014 N01 | PO0014 |
| PO0014 N02 | PO0014 |
| LL0006 N01 | LL0006 |
| PO0015 N01 | PO0015 |
| PO0015 N02 | PO0015 |
| PO0016 N01 | PO0016 |
| LL0007 N01 | LL0007 |
| LL0008 N01 | LL0008 |

| BRANCH ID | NODE ID$_1$ | NODE ID$_2$ | FACILITY ID | OPEN/CLOSE DIVISION |
|---|---|---|---|---|
| BR0001 | SS0001 N01 | PO0001 N01 | SP0001 | |
| BR0002 | PO0001 N01 | PO0001 N02 | PO0001 01 | 1 |
| BR0003 | PO0001 N02 | PO0002 N01 | SP0002 | |
| BR0004 | PO0002 N01 | PO0003 N01 | SP0003 | |
| BR0005 | PO0003 N01 | PO0004 N01 | SP0004 | |
| BR0006 | PO0004 N01 | PO0004 N02 | PO0004 01 | 1 |
| BR0007 | PO0004 N02 | PO0005 N01 | SP0005 | |
| BR0008 | PO0005 N01 | PO0006 N01 | SP0006 | |
| BR0009 | PO0006 N01 | PO0007 N01 | SP0007 | |
| BR0010 | PO0007 N01 | PO0007 N02 | PO0007 01 | |
| BR0011 | PO0007 N01 | PO0008 N01 | SP0008 | |
| BR0012 | PO0007 N02 | PO0008 N02 | SP0009 | |
| BR0013 | PO0008 N02 | LL0001 N01 | SP0010 | |
| BR0014 | LL0001 N01 | | LL0001 01 | |
| BR0018 | PO0008 N01 | PO0009 N01 | SP0011 | |
| BR0019 | PO0009 N01 | PO0009 N02 | PO0009 01 | 1 |
| BR0020 | PO0009 N02 | PO0010 N01 | SP0012 | |
| BR0021 | PO0010 N01 | PO0011 N01 | SP0013 | |
| BR0022 | PO0012 N02 | PO0011 N02 | SP0014 | |
| BR0023 | PO0011 N02 | LL0002 N01 | SP0015 | |
| BR0024 | LL0002 N01 | | LL0002 01 | |
| BR0028 | PO0011 N01 | PO0012 N01 | SP0016 | |
| BR0029 | PO0012 N01 | PO0012 N02 | PO0012 01 | |
| BR0030 | PO0012 N02 | PO0013 N01 | SP0017 | |
| BR0031 | PO0013 N01 | LL0003 N01 | SP0018 | |
| BR0032 | LL0003 N01 | | LL0003 01 | |
| BR0036 | PO0013 N01 | LL0004 N01 | SP0019 | |
| BR0037 | LL0004 N01 | | LL0004 01 | |
| BR0041 | PO0012 N02 | LL0005 N01 | SP0020 | |
| BR0042 | LL0005 N01 | | LL0005 01 | |
| BR0046 | PO0004 N01 | PO0014 N01 | SP0021 | |
| BR0047 | PO0015 N02 | PO0014 N02 | SP0022 | |
| BR0048 | PO0014 N02 | LL0006 N01 | SP0023 | |
| BR0049 | LL0006 N01 | | LL0006 01 | |
| BR0053 | PO0014 N01 | PO0015 N01 | SP0024 | |
| BR0054 | PO0015 N01 | PO0015 N02 | PO0015 01 | |
| BR0055 | PO0015 N02 | PO0016 N01 | SP0025 | |
| BR0056 | PO0016 N01 | LL0007 N01 | SP0026 | |
| BR0057 | LL0007 N01 | | LL0007 01 | |
| BR0061 | PO0015 N02 | LL0008 N01 | SP0027 | |
| BR0062 | LL0008 N01 | | LL0008 01 | |

| CONNECTION ID | POSITION ID | POWER CONSUMPTION (EFFECTIVE) | POWER CONSUMPTION (REACTIVE) |
|---|---|---|---|
| SS0001 N01 | SS0001 | | |
| PO0001 N01 | PO0001 | | |
| PO0001 N02 | PO0001 | | |
| PO0002 N01 | PO0002 | | |
| PO0003 N01 | PO0003 | | |
| PO0004 N01 | PO0004 | | |
| PO0004 N02 | PO0004 | | |
| PO0005 N01 | PO0005 | | |
| PO0006 N01 | PO0006 | | |
| PO0007 N01 | PO0007 | | |
| PO0007 N02 | PO0007 | | |
| PO0008 N01 | PO0008 | | |
| PO0008 N02 | PO0008 | | |
| LL0001 N01 | LL0001 | 200 | 20 |
| PO0009 N01 | PO0009 | | |
| PO0009 N02 | PO0009 | | |
| PO0010 N01 | PO0010 | | |
| PO0011 N01 | PO0011 | | |
| PO0011 N02 | PO0011 | | |
| LL0002 N01 | LL0002 | 220 | 22 |
| PO0012 N01 | PO0012 | | |
| PO0012 N02 | PO0012 | | |
| PO0013 N01 | PO0013 | | |
| LL0003 N01 | LL0003 | 180 | 18 |
| LL0004 N01 | LL0004 | 240 | 24 |
| LL0005 N01 | LL0005 | 210 | 21 |
| PO0014 N01 | PO0014 | | |
| PO0014 N02 | PO0014 | | |
| LL0006 N01 | LL0006 | 300 | 30 |
| PO0015 N01 | PO0015 | | |
| PO0015 N02 | PO0015 | | |
| PO0016 N01 | PO0016 | | |
| LL0007 N01 | LL0007 | 240 | 24 |
| LL0008 N01 | LL0008 | 230 | 23 |

FIG.10

| BRANCH ID | NODE ID₁ | NODE ID₂ | FACILITY ID | OPEN/ CLOSE DIVISION | REACTANCE (X) | RESIST-ANCE (R) |
|---|---|---|---|---|---|---|
| BR0001 | SS0001 N01 | PO0001 N01 | SP0001 | | 3150 | 4620 |
| BR0002 | PO0001 N01 | PO0001 N02 | PO0001 01 | 1 | 0 | 0 |
| BR0003 | PO0001 N02 | PO0002 N01 | SP0002 | | 4350 | 6380 |
| BR0004 | PO0002 N01 | PO0003 N01 | SP0003 | | 4800 | 7040 |
| BR0005 | PO0003 N01 | PO0004 N01 | SP0004 | | 4800 | 7040 |
| BR0006 | PO0004 N01 | PO0004 N02 | PO0004 01 | 1 | 0 | 0 |
| BR0007 | PO0004 N02 | PO0005 N01 | SP0005 | | 4350 | 6380 |
| BR0008 | PO0005 N01 | PO0006 N01 | SP0006 | | 3750 | 5500 |
| BR0009 | PO0006 N01 | PO0007 N01 | SP0007 | | 4650 | 6820 |
| BR0010 | PO0007 N01 | PO0007 N02 | PO0007 01 | | 31300 | 36800 |
| BR0011 | PO0007 N01 | PO0008 N01 | SP0008 | | 3600 | 5280 |
| BR0012 | PO0007 N02 | PO0008 N02 | SP0009 | | 5760 | 9360 |
| BR0013 | PO0008 N02 | LL0001 N01 | SP0010 | | 5740 | 3570 |
| BR0014 | LL0001 N01 | | LL0001 01 | | 0 | 0 |
| BR0018 | PO0008 N01 | PO0009 N01 | SP0011 | | 2850 | 4180 |
| BR0019 | PO0009 N01 | PO0009 N02 | PO0009 01 | 1 | 0 | 0 |
| BR0020 | PO0009 N02 | PO0010 N01 | SP0012 | | 3450 | 5060 |
| BR0021 | PO0010 N01 | PO0011 N01 | SP0013 | | 2100 | 3080 |
| BR0022 | PO0012 N02 | PO0011 N02 | SP0014 | | 4560 | 7410 |
| BR0023 | PO0011 N02 | LL0002 N01 | SP0015 | | 7380 | 4590 |
| BR0024 | LL0002 N01 | | LL0002 01 | | 0 | 0 |
| BR0028 | PO0011 N01 | PO0012 N01 | SP0016 | | 2850 | 4180 |
| BR0029 | PO0012 N01 | PO0012 N02 | PO0012 01 | | 31300 | 36800 |
| BR0030 | PO0012 N02 | PO0013 N01 | SP0017 | | 4320 | 7020 |
| BR0031 | PO0013 N01 | LL0003 N01 | SP0018 | | 18040 | 11220 |
| BR0032 | LL0003 N01 | | LL0003 01 | | 0 | 0 |
| BR0036 | PO0013 N01 | LL0004 N01 | SP0019 | | 17220 | 10710 |
| BR0037 | LL0004 N01 | | LL0004 01 | | 0 | 0 |
| BR0041 | PO0012 N02 | LL0005 N01 | SP0020 | | 8200 | 5100 |
| BR0042 | LL0005 N01 | | LL0005 01 | | 0 | 0 |
| BR0046 | PO0004 N01 | PO0014 N01 | SP0021 | | 3600 | 5280 |
| BR0047 | PO0015 N02 | PO0014 N02 | SP0022 | | 5760 | 9360 |
| BR0048 | PO0014 N02 | LL0006 N01 | SP0023 | | 9840 | 6120 |
| BR0049 | LL0006 N01 | | LL0006 01 | | 0 | 0 |
| BR0053 | PO0014 N01 | PO0015 N01 | SP0024 | | 3600 | 5280 |
| BR0054 | PO0015 N01 | PO0015 N02 | PO0015 01 | | 31300 | 36800 |
| BR0055 | PO0015 N02 | PO0016 N01 | SP0025 | | 3840 | 6240 |
| BR0056 | PO0016 N01 | LL0007 N01 | SP0026 | | 9020 | 5610 |
| BR0057 | LL0007 N01 | | LL0007 01 | | 0 | 0 |
| BR0061 | PO0015 N02 | LL0008 N01 | SP0027 | | 9020 | 5610 |
| BR0062 | LL0008 N01 | | LL0008 01 | | 0 | 0 |

FIG.13

| FACILITY ID | DATE | TIME | POWER CONSUMPTION |
|---|---|---|---|
| LL1 | 2012/9/5 | 15:10:19 | U12 |
| LL4 | 2012/9/5 | 14:42:33 | U40 |
| LL3 | 2012/9/5 | 14:40:29 | U30 |
| LL1 | 2012/9/5 | 14:40:18 | U11 |
| LL2 | 2012/9/5 | 14:38:59 | U20 |
| ⋮ | ⋮ | ⋮ | ⋮ |

| NODE ID | ENERGIZING STATE |
|---|---|
| N1 | 1 |
| N2 | 1 |
| N3 | 1 |
| N4 | 1 |
| N5 | 1 |
| N6 | 1 |
| N7 | 1 |
| N8 | 1 |
| N9 | 1 |
| N10 | 1 |

| BRANCH ID | NODE ID$_1$ | NODE ID$_2$ | FACILITY ID | ... |
|---|---|---|---|---|
| B1 | N1 | N2 | SP1 | ... |
| B2 | N2 | N3 | SW1 | ... |
| B3 | N3 | N4 | SP2 | ... |
| B4 | N4 | N5 | TR1 | ... |
| B5 | N5 | N6 | SP3 | ... |
| B6 | N6 | N7 | SP4 | ... |
| B7 | N7 | - | LL1 | ... |
| B8 | N5 | N8 | SP5 | ... |
| B9 | N8 | N9 | SP6 | ... |
| B10 | N9 | - | LL2 | ... |
| B11 | N8 | N10 | SP7 | ... |
| B12 | N10 | - | LL3 | ... |
| B13 | N10 | - | LL4 | ... |

17b

POWER DISTRIBUTION MANAGEMENT APPARATUS, DISPLAY CONTROL METHOD, AND RECORDING MEDIUM

CROSS-REFERENCE TO RELATED APPLICATION

This application is a continuation application of International Application PCT/JP2012/075440 filed on Oct. 1, 2012 and designating the U.S., the entire contents of which are incorporated herein by reference.

FIELD

The embodiments discussed herein are directed to a power distribution management apparatus, a display control method, and a display control program.

BACKGROUND

In a power distribution system, a high-voltage wire used to supply high-voltage power and a low-voltage wire used to supply low-voltage power are included. Standard voltages and allowable ranges to allow a deviation from the standard voltages are defined for the high-voltage wire and the low-voltage wire. For this reason, a voltage drop is calculated by dividing the power distribution system from the power substation to the load facility into a high-voltage system containing facilities such as the high-voltage wire and a switch and a low-voltage system containing facilities such as the low-voltage wire and a lead-in wire. Then, the voltage of the power distributed from the power substation is set such that a voltage before and after the voltage drop occurs remains in the allowable ranges of the high-voltage system and the low-voltage system, or the voltage of the power flowing through the power distribution system is adjusted by switching the switch disposed in the high-voltage system.

Patent Literature 1: Japanese Laid-open Patent Publication No. 10-187827
Patent Literature 2: Japanese Laid-open Patent Publication No. 2008-118799
Patent Literature 3: Japanese Examined Patent Application Publication No. 61-17221

However, in the above technology, the assumption that a reverse power flow from a distributed power source is not made so that the power exceeding a voltage allowable range in a power distribution system is not always prevented.

In other words, as a distributed power source such as photovoltaic power generation comes into wide use, the distributed power source is disposed in a customer in some cases. In this case, it may occur that the reverse power flows from the distributed power source disposed in the customer to the power distribution system of the electric power provider. Therefore, in a case where the power flows bidirectionally between the power substation and the load facility, the power levels at the respective facilities included in the low-voltage system may be significantly fluctuated due to the reverse power flow. For example, at the time when the reverse power flow occurs, even when the voltage falls within the allowable range, the load facility receives the distributed power for usage in a case where the reverse power flow does not occur. Therefore, the voltage in the power distribution system may be reduced out of the allowable range.

SUMMARY

According to an aspect of the embodiment of the invention, a power distribution management apparatus includes a processor. The processor executes a process including: acquiring a measurement result from a meter connected to a customer's load facility which receives a distributed power from a power distribution system; and using different display representation to display a facility where electricity flows from the load facility toward the facility of the power distribution system among facilities of the power distribution system to be distinguished from a facility where electricity flows from the facility of the power distribution system toward the load facility utilizing the measurement result of the meter.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is a diagram illustrating an example of a "Location" table.
FIG. 5 is a diagram illustrating an example of a "unit" table.
FIG. 6 is a diagram illustrating an example of a "span" table.
FIG. 7 is a diagram illustrating an example of a node table.
FIG. 8 is a diagram illustrating an example of a "branch" table.
FIG. 9 is a diagram illustrating an example of a current node table.
FIG. 10 is a diagram illustrating an example of a current "branch" table.
FIG. 13 is a diagram illustrating an example of a load table.
FIG. 14 is a diagram illustrating an example of a current node table.
FIG. 15 is a diagram illustrating an example of a current "branch" table.

DESCRIPTION OF EMBODIMENTS

A power distribution management apparatus, a display control method, and a display control program according to the present application will be described with reference to the accompanying drawings. Further, embodiments herein do not limit the disclosed technology. Then, the respective embodiments can be implemented by appropriately combining each other in a scope where the processing contents are compossible.

First Embodiment

[Configuration of Power Distribution Management Apparatus]

Figure 1:
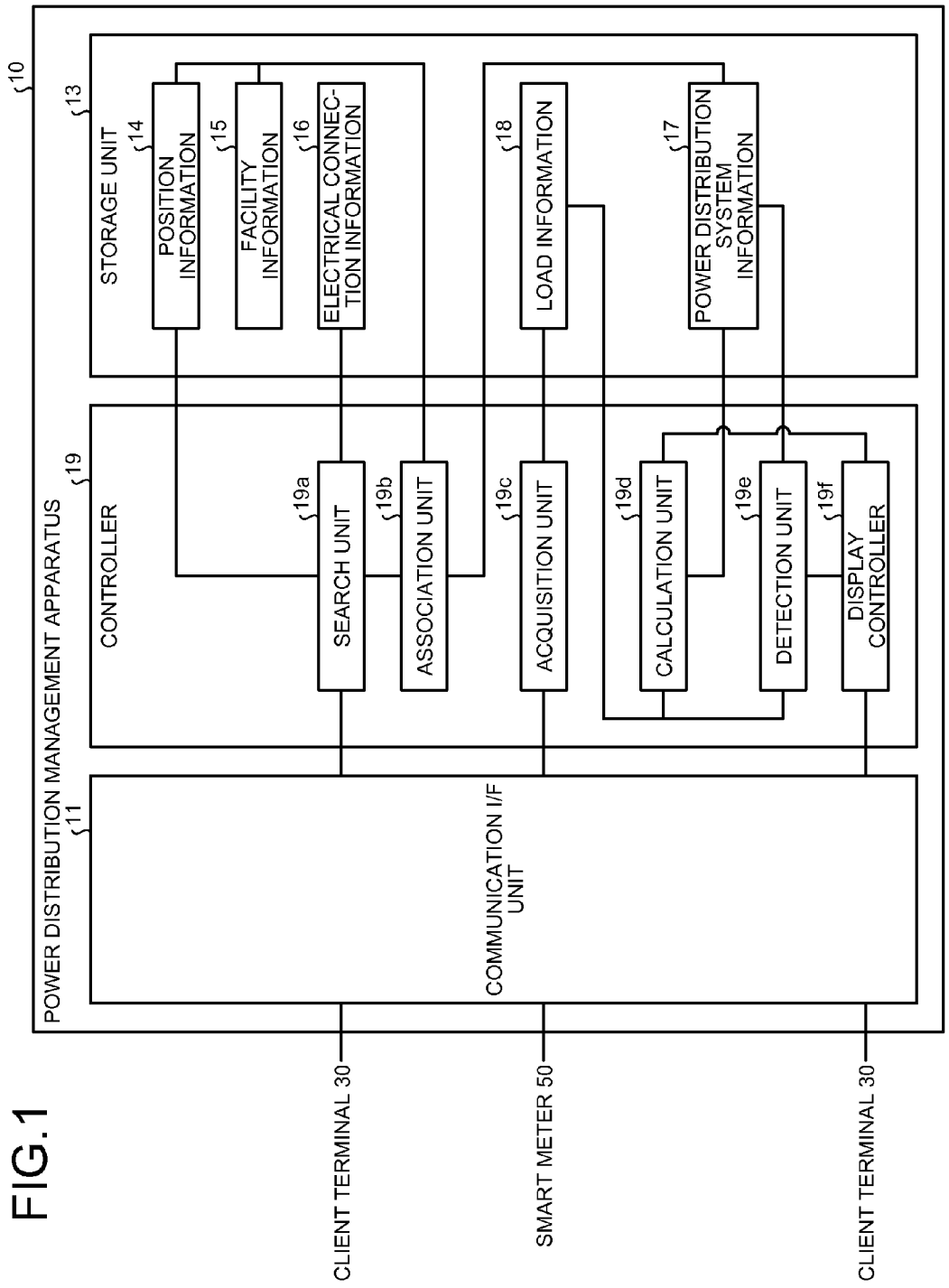
FIG. 1 is a block diagram illustrating a functional configuration of a power distribution management apparatus according to a first embodiment.

FIG. 1 is a block diagram illustrating a functional configuration of a power distribution management apparatus according to a first embodiment. A power distribution management apparatus 10 illustrated in FIG. 1 performs a display control process of displaying an electrical state (for example, a flow direction of electricity, a voltage, and an abnormal place) of a facility which is contained in a power distribution system between a substation of an electric power provider and a load facility of a customer.

As an aspect of such power distribution management apparatus 10, a Web server may be mounted to perform the display control process, or an outsourcing cloud may be mounted to provide a service of the display control process. As another embodiment, there may be provided a desired computer in which a display control program provided as package software or online software is preinstalled or installed.

As illustrated in FIG. 1, the power distribution management apparatus 10 is connected for communication with another apparatus such as a client terminal 30 or a smart meter 50 through a predetermined network. As such a network, any type of communication network such as the Internet, a LAN (Local Area Network), or a VPN (Virtual Private Network) may be employed regardless of whether the network is wired or wireless. Further, the number of the client terminals 30 and the smart meters 50 may be arbitrarily set in the connection.

The client terminal 30 is a terminal apparatus where receives the display control service. As an example of the client terminal 30, besides a fixed terminal including a personal computer (PC), a movable terminal such as a portable telephone, a PHS (Personal Handyphone System), or a PDA (Personal Digital Assistant) can also be employed. Further, the client terminal 30 is used by a member of the electric power provider, for example, a person in charge for the power distribution section or a manager.

The smart meter 50 is a power meter having a communication function. The smart meter 50 is connected to a distribution board of a customer. As an aspect, the smart meter 50 measures the power used by the load facility of the customer at every predetermined time period (for example, 30 minutes). At this time, the smart meter 50 performs the measurement by accumulating the power consumed by the load facility. In the following, the accumulated value of power consumed in the load facility may be referred to as "power consumption". Furthermore, the smart meter 50 transmits the power consumption to the power distribution management apparatus 10. Further, the description herein has been made about an example in which the smart meter uploads the power consumption at every predetermined time period, but the power consumption may be intermittently uploaded. In addition, the smart meter 50 may upload the power consumption in response to a request from the power distribution management apparatus 10 without actively uploading the power consumption.

As illustrated in FIG. 1, the power distribution management apparatus 10 includes a communication I/F (interface) unit 11, a storage unit 13, and a controller 19. Further, besides the functional units illustrated in FIG. 1, the power distribution management apparatus 10 may include various types of functional units (for example, functional units such as various types of input/output devices or an image pickup device) included in a well-known computer.

The communication I/F unit 11 is an interface for performing communication control with respect to other apparatuses (for example, the client terminal 30 or the smart meter 50). As an aspect of such communication I/F unit 11, a network interface card such as a LAN card can be employed. For example, the communication I/F unit 11 receives various information such as a browse request for a power distribution system screen from the client terminal 30, or notifies the client terminal 30 of the display data of the power distribution system screen from the power distribution management apparatus 10.

The storage unit 13 is a storage device which stores various types of programs such as an OS (Operating System) performed by the controller 19 and the display control program. As an aspect of the storage unit 13, a semiconductor memory element such as flash memory and a storage device such as a hard disk and an optical disk are exemplified. Further, the storage unit 13 is not limited to the above-mentioned storage devices, and may be RAM (Random Access Memory) or ROM (Read Only Memory).

The storage unit 13 stores position information 14, facility information 15, electrical connection information 16, power distribution system information 17, and load information 18 as an example of data used in the program executed by the controller 19. Further, besides the information as described above, another electronic data (for example, map information containing the power distribution system managed by the electric power provider) can also be stored.

Herein, in the power distribution management apparatus 10 according to the embodiment, the power distribution system is managed into three divisions as follows: a position management in which a location of the facility is managed, a facility management in which each facility is managed, and an electrical connection management in which the facilities electrically connected to each other are managed.

Among them, in the position management, a position "location" at which a predetermined facility (for example, a power substation, an power pole, a transformer, and the like) is provided among the facilities forming the power distribution system is used as an entity. In addition, in the facility management, a facility "unit" linked at a position of one of the facilities forming the power distribution system and a facility "span" linked at two positions are used as an entity. In addition, in the electrical connection management, a junction "node" at which the facilities are electrically connected to each other and a facility "branch" determined from a plurality of junctions are used as an entity.

Figure 2:
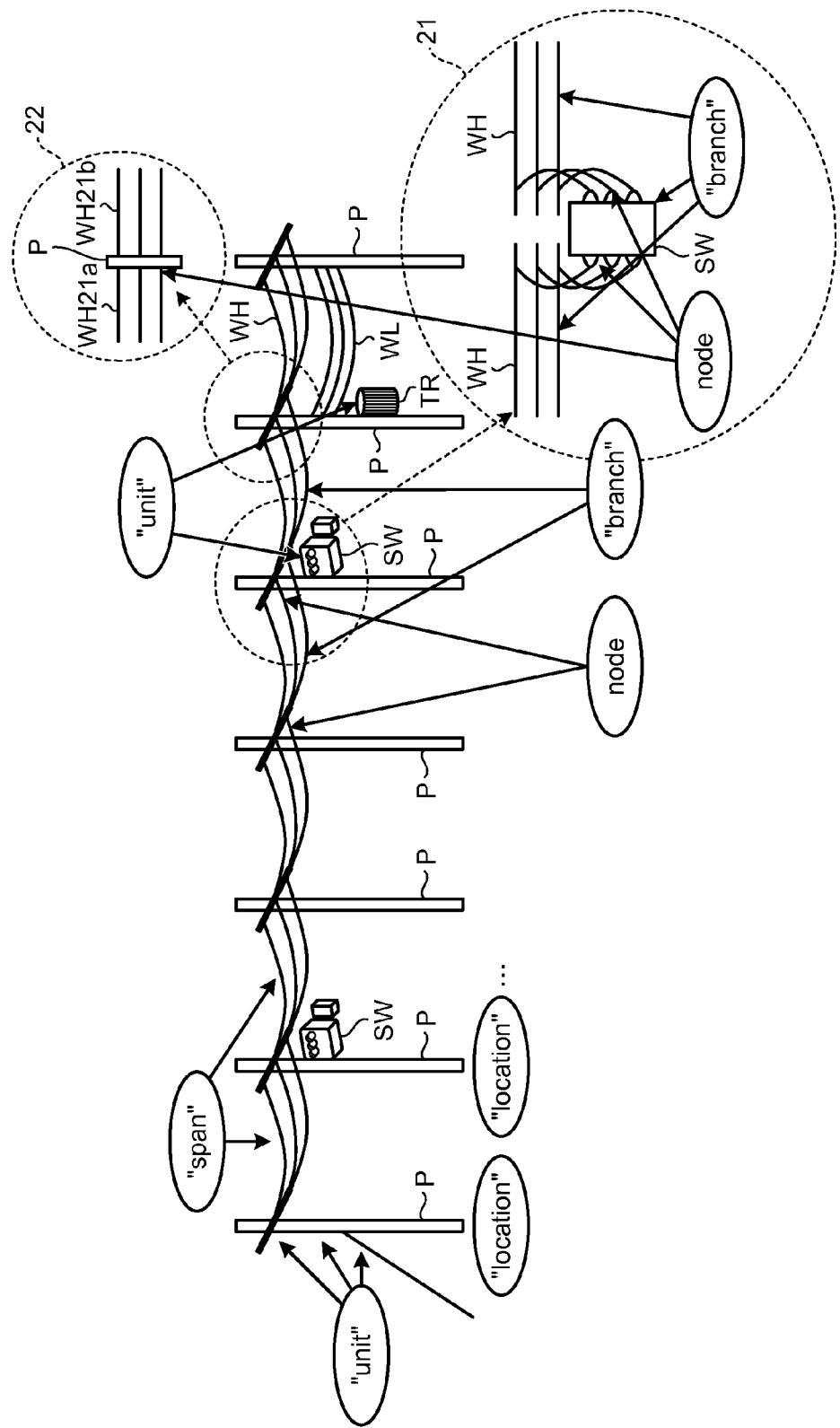
FIG. 2 is a diagram illustrating an aspect of entities.

FIG. 2 is a diagram illustrating an aspect of the entities. As illustrated in FIG. 2, as an example of the "Location", for example, there is a position where a non-installation facility (such as an power pole P and a pole transformer TR) not in an installation state is provided. Besides, a position of a power distribution substation (SS) (not illustrated) or a position of the transformer is also included in a category of the "Location". Further, the description herein has been made about the facility on the ground, but a position of a facility provided under the ground (for example, a manhole or a handhold) is also included in a category of the "Location".

As an example of a "unit", there are the power pole P, a switch SW, the pole transformer TR, and the like. Besides, while not being illustrated, the power distribution substation, an SVR (Step Voltage Regulator), and various types of meters (for example, the smart meter 50 including a manhole and a handhold which are facilities under the ground) are also included in a category of the "unit".

As an example of the "span", there is a wire (so-called "high-voltage wire") WH laid on the high-voltage system to which high-voltage power is supplied between the power distribution substation and the pole transformer TR. As another example of the "span", there is a wire (so-called "lead-in wire") laid on a section from the lead-in wire to the load facility, in addition to a wire (so-called "low-voltage wire") WL laid on a section from the pole transformer TR to the lead-in wire in the low-voltage system to which low-voltage power is supplied between the pole transformer TR and the load facility of the customer. As an example of the "span", there is a cable which is buried in the ground. Further, regarding the wire W such as the high-voltage wire WH and the low-voltage wire WL, the number (for example, 3 or 2) of installation units of the power pole P can be collectively handled as one "span".

As an example of the node, there are a junction between the high-voltage wire WH and the switch SW illustrated in an enlarged view 21 in FIG. 2, a junction between the high-voltage wire WH and the pole transformer TR, and a junction between the pole transformer TR and the low-voltage wire WL. Besides, a connection point between the high-voltage wire WH21a and the high-voltage wire WH21b illustrated in an enlarged view 22 of FIG. 2 is also included in a category of the node. Specifically, even in a case where the high-voltage wire WH21a and the high-voltage wire WH21b are installed in the power pole P as a through pole, the high-voltage wire WH21a and the high-voltage wire WH21b are considered to be electrically connected, and a connection point between the high-voltage wires WH is considered as a virtual node.

As an example of the "branch", there are various types of facilities such as the power pole P, the high-voltage wire WH, the switch SW, the pole transformer TR, the low-voltage wire WL illustrated in FIG. 2. Besides, the power distribution substation, the lead-in wire, the smart meter 50, and the load facility (not illustrated) are also included in a category of the "branch". A facility positioned at the end point of the power distribution substation, the load facility, or the like may have one node.

Figure 3:
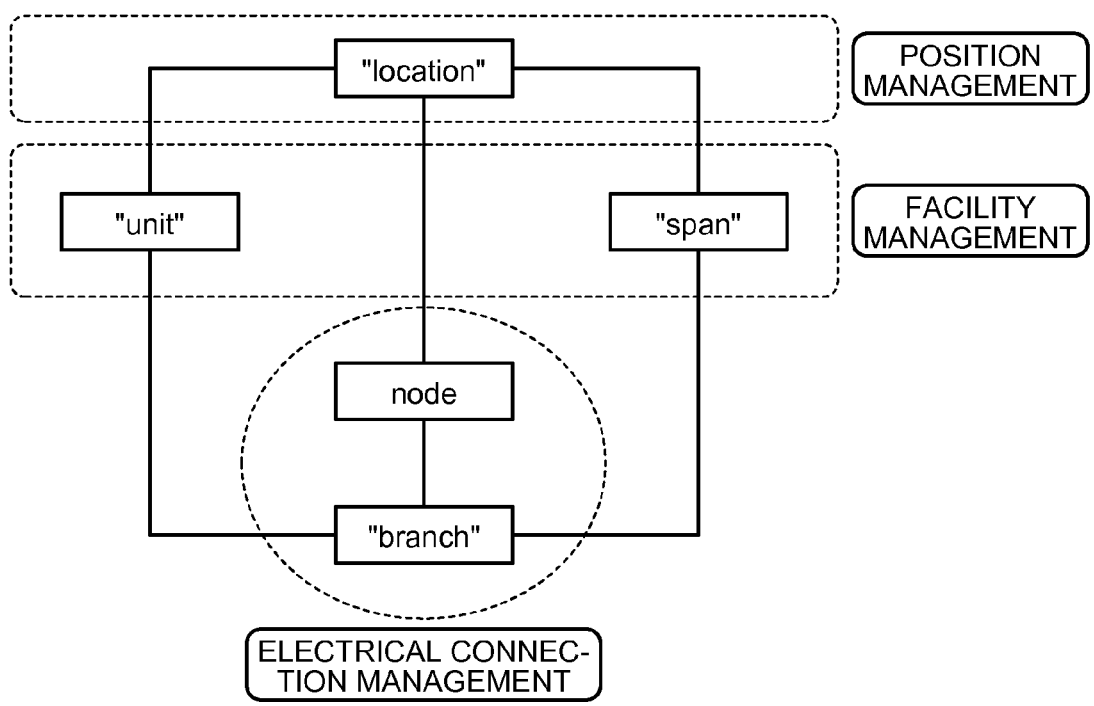
FIG. 3 is a diagram illustrating an example of a mutual relation of the entities.

The entities of the "location", the "unit", the "span", the node, and the "branch" have relevance as illustrated in FIG. 3. FIG. 3 is a diagram illustrating an example of a mutual relation of the entities. As illustrated in FIG. 3, the "location" is used for managing position information of the "unit" and the "span". In addition, the "branch" is used for managing facility information of the "unit" and the "span". Furthermore, the "location" and the "branch" are related by the node.

Returning to the description of FIG. 1, a "Location" table 14a for managing the "Location" is included in the position information 14. In addition, a "unit" table 15a for managing the "unit" and a "span" table 15b for managing the "span" are included in the facility information 15. Furthermore, a node table 16a for managing the node and a "branch" table 16b for managing the "branch" are included in the electrical connection information 16. In addition, as to be described below, a current node table 17a and a current "branch" table 17b are included in the power distribution system information 17.

Among them, as an aspect of the "Location" table 14a, a table in which items such as a position ID (identifier), a position type, a longitude, and a latitude are associated can be employed. The "position ID" indicates identification information for identifying a position where the facility is provided. In addition, the "position type" indicates information for identifying a type of the position; for example, types of a power distribution substation (SS), an power pole (POLE), and a load facility (LOADL) are included. Further, the information stored in the "Location" table 14a, for example, can acquire the position information of a specific facility such as the power substation, the power pole, and the transformer from another existing system (for example, an existing power distribution facility management system for managing the facilities in the power distribution system).

FIG. 4 is a diagram illustrating an example of the "Location" table 14a. For example, a "Location" of the position ID "SS0001" illustrated in FIG. 4 means that the power distribution substation is positioned at 128°08'48.66" east longitude and at 50°27'23.016" north latitude. In addition, in the subsequent drawings of FIG. 4, various types of IDs are indexed by adding a string identifiable for the various types of facilities such as "SS" indicating the power distribution substation, "PO" indicating the power pole, and "LL" indicating the load facility to the head of a string forming the ID. The indexing of these various types of IDs is not limited to the indexing obtained by adding the string identifiable for the various types of facilities to the head of the string forming the ID, but may be assigned with values which can be uniquely recognized. Further, herein, the longitude and the latitude are exemplified as an item for specifying the position of the facility, but another item (for example, local coordinates, addresses, and the like) may be used.

As an aspect of the "unit" table 15a, a table in which items such as a facility ID, a position ID, a type, and attribute information are associated can be employed. The "facility ID" indicates identification information for identifying the facility, and only the facility ID of the "unit" is stored in the "unit" table 15a. In addition, the "type" indicates a type of the "unit"; for example, the power pole (POLE), the switch (SW), the pole transformer (BANK), and the load facility (LOADL) are included. In addition, the "attribute information" indicates information relating to an attribute of the "unit"; for example, a serial number or performance of the "unit" is included (for example, in a case where the "unit" is a transformer, the capacity of the transformer or a voltage ratio is registered). The capacity of the transformer can be used to calculate a voltage drop when the electrical connection information of the facility of the current system is extracted. For example, in a case where the "unit" is the transformer, a resistance value, a reactance value, and a voltage ratio of the transformer are registered. Further, the information stored in the "unit" table 15a, for example, is acquired from another existing system (for example, a power-distribution facility management system), and the attribute information of the facility classified into the "unit" among the acquired attribute information of the facility is registered.

FIG. 5 is a diagram illustrating an example of the "unit" table 15a. For example, the facility ID "PO0001P1" illustrated in FIG. 5 means that the "unit" is at a position corresponding to the position ID "PO0001" (that is, 128°08'41.76" east longitude and 50°27'23.021" north latitude illustrated in FIG. 4) and is the power pole. In addition, the facility ID "PO000101" illustrated in FIG. 5 means that the "unit" is at a position corresponding to the position ID "PO0001" (that is, 128°08'41.76" east longitude and 50°27'23.021" north latitude illustrated in FIG. 4) and is the switch. In addition, the facility ID "PO000701" illustrated in FIG. 5 means that the "unit" is at a position corresponding to the position ID "PO0007" (that is, 128°08'34.30" east longitude and 50°27'27.844" north latitude illustrated in FIG. 4), and is the pole transformer having a voltage ratio of 1.

As an aspect of the "span" table 15b, a table in which items such as a facility ID, a position $ID_1$, a position $ID_2$, a type, and attribute information are associated can be employed. The "facility ID" herein also indicates the identification information for identifying the facility, and only the facility ID of the "span" is stored in the "span" table 15b. In addition, the "position $ID_1$" indicates the position ID of one of two position IDs linked to the "span", and the "position $ID_2$" indicates the position ID of the other one of two position IDs linked to the "span". In addition, the "type" indicates a type of the "span"; for example, the high-voltage wire, the low-voltage wire, and the lead-in wire are included. In addition, the "attribute information" indicates information relating to the attribute of the "span"; for example, a serial number of the "span", a thickness, a material, a span size, a resistance value per unit (m), and a reactance value per unit (m) are included. The span size, the resistance valve per unit, and the reactance value per unit can be used to calculate a voltage drop when the electrical connection information of the facility of the current system is extracted. Further, the information stored in the "span" table 15b, for example, is acquired from another existing system (for example, the power-distribution facility management system), and the attribute information of the facility classified into the "span" among the acquired attribute information of the facility is registered.

FIG. 6 is a diagram illustrating an example of the "span" table 15b. For example, the facility ID "SP0001" illustrated in FIG. 6 means that the "span" is a three-phase high-voltage wire installed in a section at positions corresponding the position $ID_1$ "SS0001" and the position $ID_2$ "PO0001". The section corresponds to a section from 128°08'48.66" east longitude and 50°27'23.016" north latitude to 128°08'41.76" east longitude and 50°27'23.021" north latitude as described using FIG. 4. Furthermore, the span size, the resistance value, and the reactance value of the facility ID "SP0001" mean "21 m", "220 Ω/m", and "150 Ω/m", respectively. Further, in a case where the type illustrated in FIG. 6 is 3H, it means that the "span" is single-phase three high-voltage wires, and in a case where the type is 3L, it means that the "span" is single-phase three low-voltage wires. In addition, in a case where the type is a blank, it means that the "span" is a lead-in wire.

As an aspect of the node table 16a, a table in which items such as a node ID and a position ID are associated can be employed. The "node ID" indicates the identification information for identifying the node. Further, the information stored in the node table 16a is acquired from a power distribution automation system which performs a monitoring operation and a remote operation of the switch in another existing system (for example, the power-distribution facility management system and the power distribution system). For example, the node is extracted from the facility information of the low-voltage system acquired from the power-distribution facility management system or the facility information of the high-voltage system acquired from the power distribution automation system, and then the node is registered in the node table 16a in association with a predetermined position.

FIG. 7 is a diagram illustrating an example of the node table 16a. For example, the node ID "SS0001N01" illustrated in FIG. 7 means that the junction is at a position corresponding to the position ID "SS0001" (that is, 128°08'48.66" east longitude and 50°27'23.016" north latitude illustrated in FIG. 4). In addition, the node IDs "PO0001N01" and "PO0001N02" illustrated in FIG. 7 mean that the junctions are at the same position corresponding to the position ID "PO0001" (that is, 128°08'41.76" east longitude and 50°27'23.021" north latitude illustrated in FIG. 4).

As an aspect of the "branch" table 16b, a table in which items such as a branch ID, a node $ID_1$, a node $ID_2$, a facility ID, and an open/close division are associated can be employed. The "branch ID" indicates the identification information for identifying the "branch". In addition, the "node $ID_1$" indicates one node ID of two node IDs of the "branch", and "the node $ID_2$" indicates the other node ID of two node IDs of the "branch". However, the "branch" positioned at the end point of the power distribution substation or the load facility may have any one node ID in the node $ID_1$ and the node $ID_2$. For example, regarding the node $ID_1$ and the node $ID_2$, the node ID on the primary side from the node $ID_2$ (that is the node ID of the junction near the electric power substation) is registered in the node $ID_1$, and at the same time the node ID on the secondary side from the node $ID_1$ (that is, the node ID of the junction near the load facility) is registered in the node $ID_2$. In addition, the "facility ID" herein also indicates the identification information for identifying the facility, and the facility ID of any one of the "unit" and the "span" are stored in the "branch" table 16b. In addition, the "open/close division" indicates the open/close state of the switch. In the open/close division, in a case where the "branch" is a switch, an "open state" or a "close state" is set, but in a case where the "branch" is not the switch, a "blank" is registered.

Further, the information stored in the "branch" table 16b is acquired from another existing system (for example, the power-distribution facility management system and the power distribution automation system). For example, after the "branch" is extracted out of the facility information of the low-voltage system acquired from the power-distribution facility management system or the facility information of the high-voltage system acquired from the power distribution automation system, the extracted "branch" is registered in the "branch" table 16b in association with the node of the "branch".

FIG. 8 is a diagram illustrating an example of the "branch" table 16b. For example, the branch ID "BR0001" illustrated in FIG. 8 means that the "branch" is the high-voltage wire of the facility ID "SP0001" defined by the node $ID_1$ "SS0001N01" and the node ID "PO0001N01". In addition, the branch ID "BR0002" illustrated in FIG. 8 means that the "branch" is the switch of the facility ID "PO000101"

defined by the node ID$_1$ "PO0001N01" and the node ID$_2$ "PO0001N02", and since the open/close division is set to "1", it means that the switch is in the close state. Further, in a case where the open/close division illustrated in FIG. 8 is set to "0", it means that the switch is in the open state, and in a case where the open/close division is set to a blank, it means that the facility is not the switch. The close state of the switch indicates a conductive state, and the open state indicates a nonconductive state.

Further, in the information stored in the storage unit 13, the power distribution system information 17 and the load information 18 besides the position information 14, the facility information 15, and the electrical connection information 16 will be described below along with the descriptions of functional units serving to generate, acquire, or use these pieces of information.

The controller 19 includes an internal memory for storing programs defining various processes and control data, and executes various processes using these programs and data. As illustrated in FIG. 1, the controller 19 includes a search unit 19a, an association unit 19b, an acquisition unit 19c, a calculation unit 19d, and a detection unit 19e, and a display controller 19f.

The search unit 19a is a processing unit which searches a "branch" corresponding to the subject combination with reference to the electrical connection information 16 while investigating an uninvestigated node among the nodes included in a node combination starting from a predetermined node.

As an aspect, the search unit 19a activates the process in a case where a browse request of the power distribution system information is received through the client terminal 30 or in a case where a certain time period elapses after the previous process is executed. First, the search unit 19a searches a position ID of which the position type is the power distribution substation "SS" among the position IDs stored in the "Location" table 14a. Then, the search unit 19a registers the position ID of the power distribution substation SS investigated from the "Location" table 14a in an investigation list stored in an internal memory (not illustrated). Besides the position ID of the power distribution substation SS as an investigation target, an uninvestigated node or an uninvestigated "branch" which is found out at the time of the investigation is registered in the investigation list whenever it is founded out. Further, herein, a case of searching the position ID of the power distribution substation SS from the "Location" table 14a has been exemplified, but it may be configured to search a node ID starting with "SS" in a string among the node IDs stored in the node table 16a or the "branch" table 16b.

Subsequently, the search unit 19a selects one position ID of the power distribution substation SS registered in the investigation list. Then, the search unit 19a searches a node corresponding to the position ID of the power distribution substation SS on which the selection is previously performed among the nodes stored in the node table 16a. Thereafter, the search unit 19a registers a record of the node searched from the node table 16a in the current node table 17a stored as the power distribution system information 17 in the storage unit 13. Furthermore, the search unit 19a registers the node searched from the node table 16a in the investigation list. Further, in a case where the power distribution substation SS includes a plurality of SS banks, even when the search is performed using one position ID, the records of the plurality of nodes are searched.

Then, the search unit 19a selects one node registered in the investigation list. Subsequently, the search unit 19a searches a record of the "branch" having a combination of the node IDs in which the previously-selected node is included (that is, a combination of the node ID$_1$ and the node ID$_2$) among the "branches" stored in the "branch" table 16b. Thereafter, the search unit 19a registers the record of the "branch" searched from the "branch" table 16b to the current "branch" table 17b stored as the power distribution system information 17 in the storage unit 13. Furthermore, the search unit 19a registers the "branch" searched from the "branch" table 16b in the investigation list. At this time, the one registered in the investigation list may be information for identifying the "branch". For example, at least one of the branch ID or the facility ID may be registered.

Subsequently, the search unit 19a selects one "branch" registered in the investigation list. Then, the search unit 19a searches the attribute information corresponding to the facility ID of the "branch" on which the selection is previously performed from the "span" table 15b. At this time, in a case where the "branch" is a "span", the attribute information can be searched from the "span" table 15b, but in a case where the "branch" is a "unit", it is not possible to search the attribute information. For this reason, in a case where it is not possible to search the attribute information from the "span" table 15b, the search unit 19a searches the attribute information corresponding to the facility ID of the "branch" on which the selection is previously performed from the "unit" table 15a.

Thereafter, in a case where the other node paring with the node used in the investigation among the combination of the nodes is not a blank, the search unit 19a determines whether the subject "branch" is the switch. Then, in a case where the "branch" is a switch, the search unit 19a determines whether the switch is in the close state (that is, whether the open/close division is "1"). At this time, in a case where the switch is in the close state, the search unit 19a searches the record of the other node from the node table 16a and then registers the searched node in the current node table 17a of the power distribution system information 17. Furthermore, the search unit 19a adds the other node to the investigation list as the uninvestigated node.

Then, the search unit 19a repeatedly performs the processes from the selection of the uninvestigated "branch" to the current process until all the "branches" registered in the investigation list are investigated. Thereafter, when all the "branches" registered in the investigation list are investigated, the search unit 19a repeatedly performs the processes from the selection of the uninvestigated node to the current process until all the nodes registered in the investigation list are investigated. Then, the search unit 19a repeatedly performs the processes from the selection of the position ID of the uninvestigated power distribution substation SS to the current process until all the position IDs of the power distribution substations SS registered in the investigation list are investigated.

The association unit 19b is a processing unit which associates the facility (obtained from the combination of junctions where the investigation is performed and a result of the search) and the attribute information of a facility obtained as a result of the search among the attribute information contained in the facility information 15. As an aspect, the association unit 19b associates the record of the "branch" where the investigation is performed and the attribute information of the "branch" searched from the "span" table 15b or the "unit" table 15a. For example, the association unit 19b registers the attribute information of the "branch" in association with the facility ID or the branch ID of the "branch" used in the search of the "span" table 15b or the "unit" table 15a among the records stored in the current "branch" table 17b. At this time, the association unit 19b searches the position ID corresponding to the facility ID of the "branch" from the "unit" table 15a or the "span" table 15b and then further associates the position ID.

Herein, a processing content of the search unit 19a and the association unit 19b will be specifically described using the respective tables of FIGS. 4 to 8. First, the position ID "SS0001" of which the position type is the power distribution substation "SS" is searched among the position IDs stored in the "Location" table 14a Illustrated in FIG. 4. Then, the position ID "SS0001" of the power distribution substation SS searched from the "Location" table 14a is registered in the investigation list. In this case, since only the position ID "SS0001" of the power distribution substation SS is registered in the investigation list, the position ID "SS0001" is selected. Then, the node ID "SS0001N01" corresponding to the position ID "SS0001" of the power distribution substation SS on which the selection is previously performed is searched among the nodes stored in the node table 16a illustrated in FIG. 7. Subsequently, the record of the node ID "SS0001N01" searched from the node table 16a is registered in the current node table 17a. Furthermore, the node ID "SS0001N01" searched from the node table 16a is registered even in the investigation list. In this case, since only the node ID "SS0001N01" is registered in the investigation list, the node ID "SS0001N01" is selected.

Then, the node $ID_1$ "SS0001N01" is searched among the "branches" stored in the "branch" table 16b illustrated in FIG. 8, and the "branch" of the facility ID "SP0001" having the combination of the node $ID_1$ "SS0001N01" and the node $ID_2$ "PO0001N01" is found. Thereafter, the record of the "branch" of the facility ID "SP0001" searched from the "branch" table 16b is registered in the current "branch" table 17b. Furthermore, the facility ID "SP0001" searched from the "branch" table 16b is registered in the investigation list. In this case, since only the facility ID "SP0001" is registered in the investigation list, the facility ID "SP0001" is selected.

Then, the attribute information "span size 21 m, resistance $R_{X1}$, reactance $X_{X1}$" of the "span" corresponding to the facility ID "SP0001" on which the selection is previously performed is searched from the "span" table 15b illustrated in FIG. 5. Further, herein, the description has been made about a case where the attribute information of the "span" is searched. However, in a case where the facility ID starts with a string other than "SP", the attribute information is not searched from the "span" table 15b, but the attribute information of the "unit" is searched from the "unit" table 15a illustrated in FIG. 5.

From the attribute information "span size 21 m, resistance 220 Ω/m, reactance 150 Ω/m" thus obtained, a resistance value of 4621 (220×21) Ω and a reactance value of 3150 (150×21) Ω are registered in the current "branch" table 17b in association with the record of the "branch" of the facility ID "SP0001" used in searching the "span" table 15b.

Thereafter, the other node ID "PO0001N01" paring with the node ID "SS0001N01" used in the investigation is set as a value in the combination of the node $ID_1$ "SS0001N01" and the node $ID_2$ "PO0001N01". In this way, since the other node ID is not a blank, it is determined whether the "branch" of the subject facility ID "SP0001" is a switch. Then, in the "branch" of the facility ID "SP0001", a value of the open/close division is a blank, and the "branch" is not the switch. Therefore, the record of the other node ID "PO0001N01" is searched from the node table 16a and then the record of the other node ID "PO0001N01" is registered in the current node table 17a of the power distribution system information 17. Furthermore, the other node ID "PO0001N01" is added to the investigation list as an uninvestigated node.

In this way, at the time when the other node ID "PO0001N01" is registered in the investigation list as an uninvestigated node, the node ID other than the node ID "PO0001N01" is not registered. Therefore, the node ID "PO0001N01" is investigated and then the search is kept on.

Further, herein, the case where the other node ID is not a blank has been exemplified, but in a case where the other node ID is a blank, the investigation of the uninvestigated "branch" registered in the investigation list is performed. In addition, when the uninvestigated "branch" is not present, the investigation of the uninvestigated node is performed. Then, when the position ID of the uninvestigated power distribution substation SS is not present, the investigation is ended. In addition, herein, the case where the "branch" is not a switch has been exemplified, but in a case where the "branch" is a switch, when the switch is not in the close state, the search of the other node ID and the addition of the other node to the investigation list are not performed. This is because in a case where the switch is in the open state, when the search of the other node ID and the addition of the other node to the investigation list are performed, another power distribution system which is not electrically connected is erroneously registered in the current node table 17a or the current "branch" table 17b.

Through the above investigation, it is possible to generate the current node table 17a containing nodes of the power distribution system of which facilities are electrically connected to each other at the time of investigation among the "branches" registered in the node table 16a. Furthermore, through the above investigation, it is possible to generate the current "branch" table 17b in which "branches" electrically connected to each other in the power distribution system and the attribute information corresponding to the "branch" at the time of investigation are searched among the "branches" registered in the "branch" table 16b and then the "branch" and the attribute information are associated. Further, in the following, the power distribution system of which the facilities are electrically connected to each other at the time of investigation may be referred to as a "current system".

The power distribution system information 17 containing the current node table 17a and the current "branch" table 17b thus generated is registered in the storage unit 13. FIG. 9 is a diagram illustrating an example of the current node table 17a. FIG. 10 is a diagram illustrating an example of the current "branch" table 17b. In FIGS. 9 and 10, the current node table 17a and the current "branch" table 17b which are generated by using the respective tables illustrated in FIGS. 4 to 8 are illustrated starting from the node ID "SS0001N01".

As illustrated in FIG. 9, among the records of the current node table 17a, the power consumption (as an example of the attribute information) measured by a meter such as a smart meter is registered in the records of the nodes "LL0001N01", "LL0002N01", "LL0003N01", "LL0004N01", "LL0005N01", "LL0006N01", "LL0007N01", and "LL0008N01" which are the junctions between the load facilities of the customers and the facilities of the power distribution system. The power consumption contains "effective power" which is consumed by the load facility and "reactive power" which is not consumed by the load facility. Among them, the reactive power is called delay reactive power. The power consumption (effective) and the power consumption (reactive) are referred in a case where the power of each node is calculated.

As illustrated in FIG. 10, the value of the open/close division registered in the "branch" table 16b is registered in a record in which the facility of the "branch" is a switch among the records of the current "branch" table 17b. For example, since all the open/close divisions are registered with a value of "1" in the switch of the branch IDs "BR0002", "BR0006", and "BR0019", it means that the switches are in the close state and in the energizing state. In FIG. 10, the switch of which the open/close division is "1" has been exemplified, in a case where the open/close division of the switch is "0", it means that the switch is in the open state and not in the energizing state. In addition, a reactance value X and a resistance value R (as an example of the attribute information) are registered in the respective records of the current "branch" table 17b. Among them, in a case where the facility of the "branch" is a "unit" (for example, the switch or the transformer), the reactance value X and the resistance value R registered in the "unit" table 15a are registered as the attribute information without any change. On the other hand, in a case where the facility of the "branch" is a "span", a value obtained by multiplying the value of the span size by the reactance value per unit registered in the "span" table 15 is registered as the reactance value X, and a value obtained by multiplying the value of the span size by the resistance value per unit is registered as the resistance value R. The reactance value X and the resistance value R of these "unit" and "span" are referred in a case where a voltage at each node is calculated.

Further, herein, the power consumption (effective), the power consumption (reactive), the resistance value, and the reactance value have been exemplified as a parameter used for calculating the voltage, a connection chase item to which the transformer is connected is added in any one of the current node table 17a or the current "branch" table 17b, so that the calculation of the voltage can be accurately performed. For example, in a case where the wires are the single-phase three wires, a first transformer connected to the wire on a pole is referred to as "connection phase 1", a second one is referred to as "connection phase 2", and a third one is referred to as "connection phase 3". Further, in a case where the transformer is connected to the first and second wires of the three wires, a value of "A" can be registered, in a case where the second and third wires are connected to the transformer, the value of "B" can be registered, and in a case where the first and third wires are connected to the transformer, a value of "C" can be registered.

Figure 11:
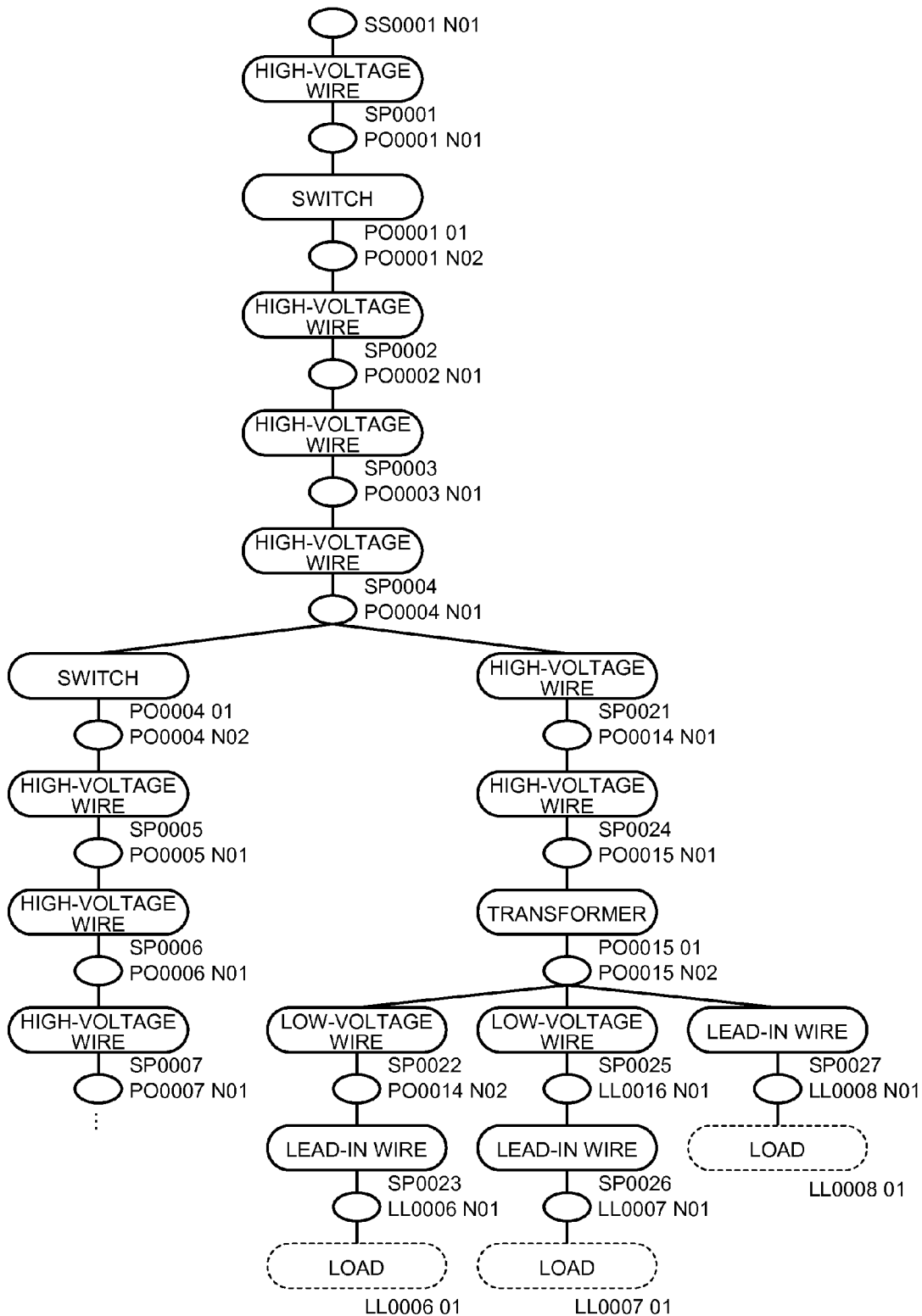
FIG. 11 is a diagram (1) illustrating an example of a graph structure of a power distribution system.
Figure 12:
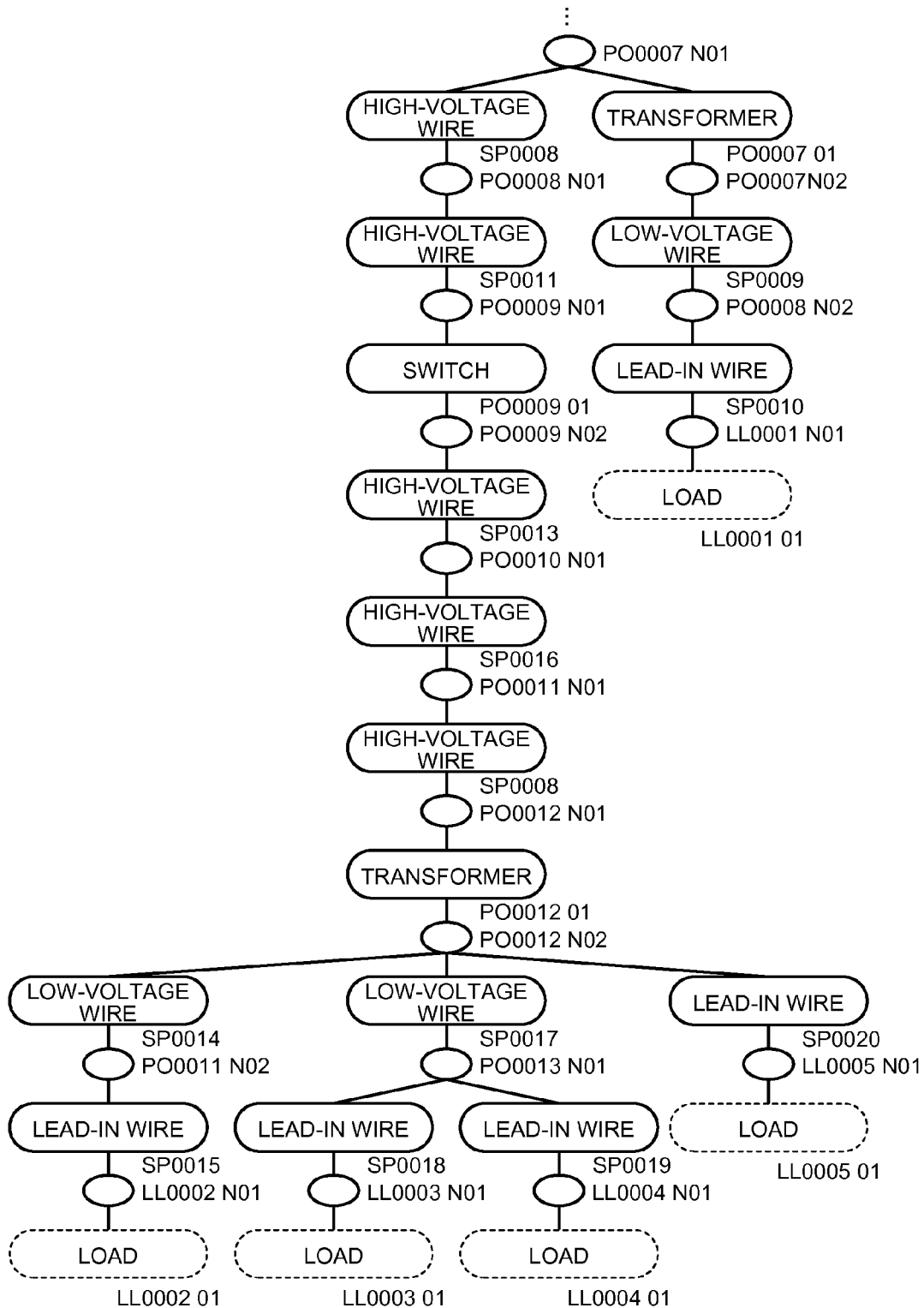
FIG. 12 is a diagram (2) illustrating an example of the graph structure of the power distribution system.

As described above, the power distribution system information 17 generated from the current node table 17a illustrated in FIG. 9 and the current "branch" table 17b illustrated in FIG. 10 indicates graphs of the power distribution system illustrated in FIGS. 11 and 12. FIGS. 11 and 12 are diagrams illustrating an example of the graph structure of the current system. The current system illustrated in FIGS. 11 and 12 has a node of a node ID "SS0001N01" which represents a junction between the SS bank and a high-voltage wire of a facility ID "SP0001" as a root (layer 1) of a hierarchical structure. Furthermore, the current system has a route from the root toward eight load facilities of the facility IDs "LL000101", "LL000201", "LL000301", "LL000401", "LL000501", "LL000601", "LL000701", and "LL000801" at the end terminals. In the drawing, it can be seen that the layers from the SS bank to the load facility of the facility ID "LL000801" are the lowest as 10 layers, and the layers from the SS bank to the load facilities of the facility IDs "LL000201", "LL000301" and "LL000401" are the deepest as 19 layers. In this way, with the power distribution system information 17 thus generated, the electrical connection in the current system can be ascertained by subdividing the system in a unit of facility or a unit of junction between the facilities not in a rough unit such as the high-voltage system or the low-voltage system.

Returning to the description of FIG. 1, the acquisition unit 19c is a processing unit which acquires the power consumption of the smart meter 50. As an aspect, the acquisition unit 19c acquires the power consumption which is updated from the smart meter 50 connected to the load facility of each customer. Subsequently, the acquisition unit 19c additionally registers the facility ID of the load facility connected to the smart meter 50, an updated date, a time, and a record associated with the power consumption in a load table 18a of the load information 18. For example, it is assumed a case where the smart meter 50 updates the power consumption at every predetermined time period (for example, 30 minutes). In this case, the record is registered in the load table 18a for each smart meter 50 in a cycle corresponding to a sum of a meter reading interval for notifying the smart meter 50 of the reading result of the power consumption and a transmission delay time between the smart meter 50 and the power distribution management apparatus 10.

Herein, an example of the load information 18 stored in the storage unit 13 will be described. The load information 18 can employ the items such as the load table 18a in which the facility ID, the date, the time, and the power consumption are associated. FIG. 13 is a diagram illustrating an example of the load table 18a. As illustrated in FIG. 13, power consumption U11 and power consumption U12 are uploaded from the smart meter 50 connected to the load facility of the facility ID "LL1" at a time of 14:40:18 and a time of 15:10:19 on a date of 05/09/2012. In addition, after power consumption U20 is uploaded from the smart meter 50 connected to the load facility of the facility ID "LL2" at a time of 14:38:59 on a date 2012/9/5, the uploading is stopped up to at least 15:10:19. Furthermore, the uploading from the respective smart meters 50 connected to the load facilities of the facility IDs "LL3" and "LL4" is also stopped 30 minutes or more after a time 14:40:29 or a time 14:42:33 on a date of 05/09/2012. Further, for the convenience of explanation on the detection of an abnormal place, FIG. 13 illustrates an example of the load facility independent from the example of the facility illustrated in the "unit" table 15a of FIG. 5.

The calculation unit 19d is a processing unit which calculates a voltage in each current node. As an aspect, in a case where a history on the power consumption uploaded from the smart meter 50 is updated in the load table 18a, the calculation unit 19d activates a process of calculating a voltage in each current node from the current of the substation to the current node of the load facility of each power distribution system.

Making an explanation on the process in detail, the calculation unit 19d reads information to be used for the calculation of the voltage from the current "branch" table 17b. For example, the calculation unit 19d acquires a voltage of the power transmitted from the substation, a voltage ratio of the transformer, a resistance and a reactance of the wire, and the like. In the following, the voltage of the power transmitted from the substation may be referred to as a "transmission voltage". Furthermore, the calculation unit 19d reads the power consumption in the load facility of each customer from the load table 18a. For example, in a case were an amount of power generation exceeds the power consumption, the power consumption takes a negative value. In this way, in a case where the power consumption becomes a negative value, a reverse power flow occurs so that the power generated by a power generating facility flows from the load facility to the power distribution system. In this case, there is performed a power purchase in which the electric power provider buys the power from the customer.

Thereafter, the calculation unit 19d calculates the voltage of the current node using the parameters such as the transmission voltage of the substation, the voltage ratio of the transformer, the resistance and the reactance of the wire, and the power consumption of the load facility. As an example of a calculation method of the power, a well-known algorithm such as a Newton-Raphson method in addition to a BFS (Backward-Forward Sweep) can be adaptively employed. For example, in a case where the BFS is employed, sequential calculation from the load facility and correction from the substation are alternately performed to calculate the voltage of each current node by taking advantage of a characteristic that the power distribution system is radically formed. Therefore, the voltage of the current node of the terminal of the load facility of the customer is calculated.

The detection unit 19e is a processing unit which detects an abnormal place in the power distribution system. As an aspect, the detection unit 19e determines whether an energizing state of each node included in the load facility of the customer is a connection state or a blackout state using the load information 18. Then, while targeting a node of which the energizing state is the connection state among the nodes of the load facility of the customer, the detection unit 19e searches a node on a side near the substation (that is, the primary side) from the subject node to detect the node of which the energizing state is the connection state. Furthermore, while targeting a node of which the energizing state is the blackout state among the nodes of the load facility of the customer, the detection unit 19e performs the search from the subject node toward a node on the primary side to detect the node of which the energizing state is the blackout state. Thereafter, the detection unit 19e detects a "branch" having the node of which the energizing state is the connection state and the node of which the energizing state is the blackout state as a "branch" where an abnormality such as a failure or an accident occurs. Further, in the following, the node of the load facility of the customer may be referred to as a "terminal node", the node of which the energizing state is the connection state as a "connection node", the node of which the energizing state is the blackout state as a "blackout node", and the "branch" where an abnormality occurs as an "abnormal "branch"".

The determination on the energizing state of the terminal node will be described. For example, the detection unit 19e activates a process at every time when (the meter reading interval of the smart meter 50+the transmission delay time between the smart meter 50 and the power distribution management apparatus 10) elapses after the detection of the abnormal "branch" is performed at the last time. First, the detection unit 19e sets all the "branches" registered in the current node table 17a to an "undefined" energizing state. Then, the detection unit 19e searches a current "branch" having the facility ID of the load facility connected to the smart meter 50 from the current "branch" table 17b. Subsequently, the detection unit 19e registers the current "branch" searched from the current "branch" table 17b in the investigation list.

Thereafter, the detection unit 19e selects one current "branch" from the investigation list. Subsequently, the detection unit 19e searches a record corresponding to the facility ID of the current "branch" on which the selection is performed previously from the load table 18a. Then, in a case where the records corresponding to the facility ID of the current "branch" are searched, the detection unit 19e determines whether the latest record among the searched records is acquired within a predetermined time period (for example, the meter reading interval "30 minutes"+the transmission delay time "α") from the current time. For example, the detection unit 19e determines whether a time obtained by adding the predetermined time period (for example, the meter reading interval+the transmission delay time) to the time of the latest record falls within the current time. The "current time" herein indicates a time at the date when the process is performed.

At this time, in a case where the latest record is acquired within the predetermined time period from the current time, the detection unit 19e sets the energizing state of the node (that is, the terminal node) on the primary side of the current "branch" to "Connection". On the other hand, in a case where the record is not searched from the load table 18a, or in a case where the record is searched but the date and the time of the latest record are not obtained within the predetermined time period from the current time, the detection unit 19e sets the energizing state of the terminal node to "Blackout". Thereafter, the detection unit 19e repeatedly performs the determination on the energizing state of the terminal node until the uninvestigated "branch" disappears from the investigation list.

Herein, a specific example of the determination on the energizing state of the terminal node will be described using FIGS. 14 to 17. FIG. 14 is a diagram illustrating an example of the current node table 17a. FIG. 15 is a diagram illustrating an example of the current "branch" table 17b. Further, the tables illustrated in FIGS. 14 and 15 are substantially similar to the node table 16a illustrated in FIG. 7 and the "branch" table 16b illustrated in FIG. 8, while items used for the detection of the abnormal "branch" are added and items not used for the detection of the abnormal "branch" are omitted. For example, the item of the energizing state used for the detection of the abnormal "branch" is added in the current node table 17a illustrated in FIG. 14 compared to the node table 16a illustrated in FIG. 7, and even though the position ID is not denoted, also the position ID is normally considered to be registered while the notation is omitted. In addition, while the open/close division not used for the detection of the abnormal "branch" is not denoted in the current "branch" table 17b illustrated in FIG. 15, also the open/close division may be registered while the notation is omitted. Further, for the convenience of explanation on the detection of the abnormal "branch", FIGS. 14 and 15 illustrate an example of the node and the "branch" of the power distribution system different from the graph structure of the power distribution system illustrated in FIGS. 11 and 12.

Figure 16:
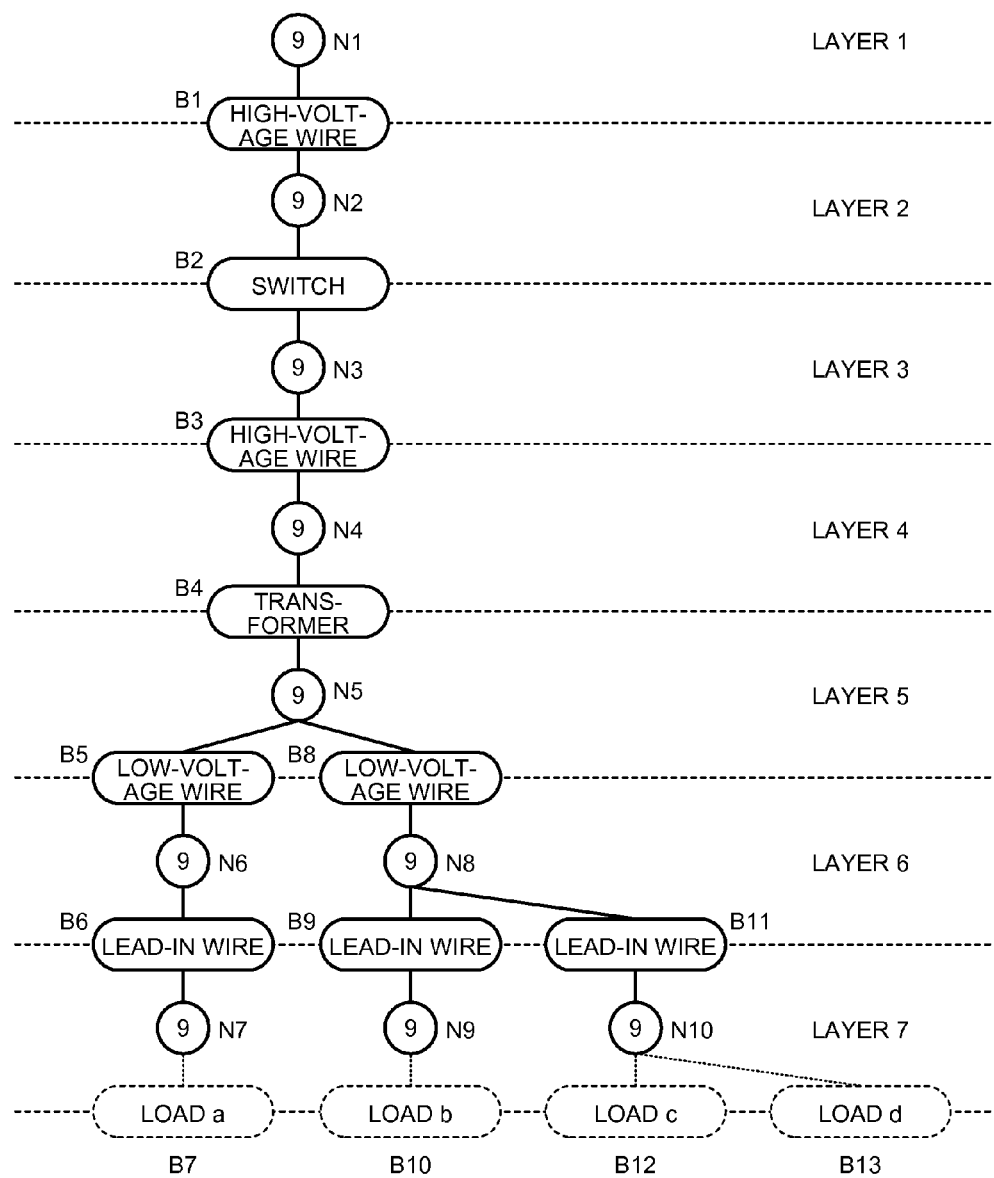
FIG. 16 is a diagram illustrating an example of the graph structure of the current system.
Figure 17:
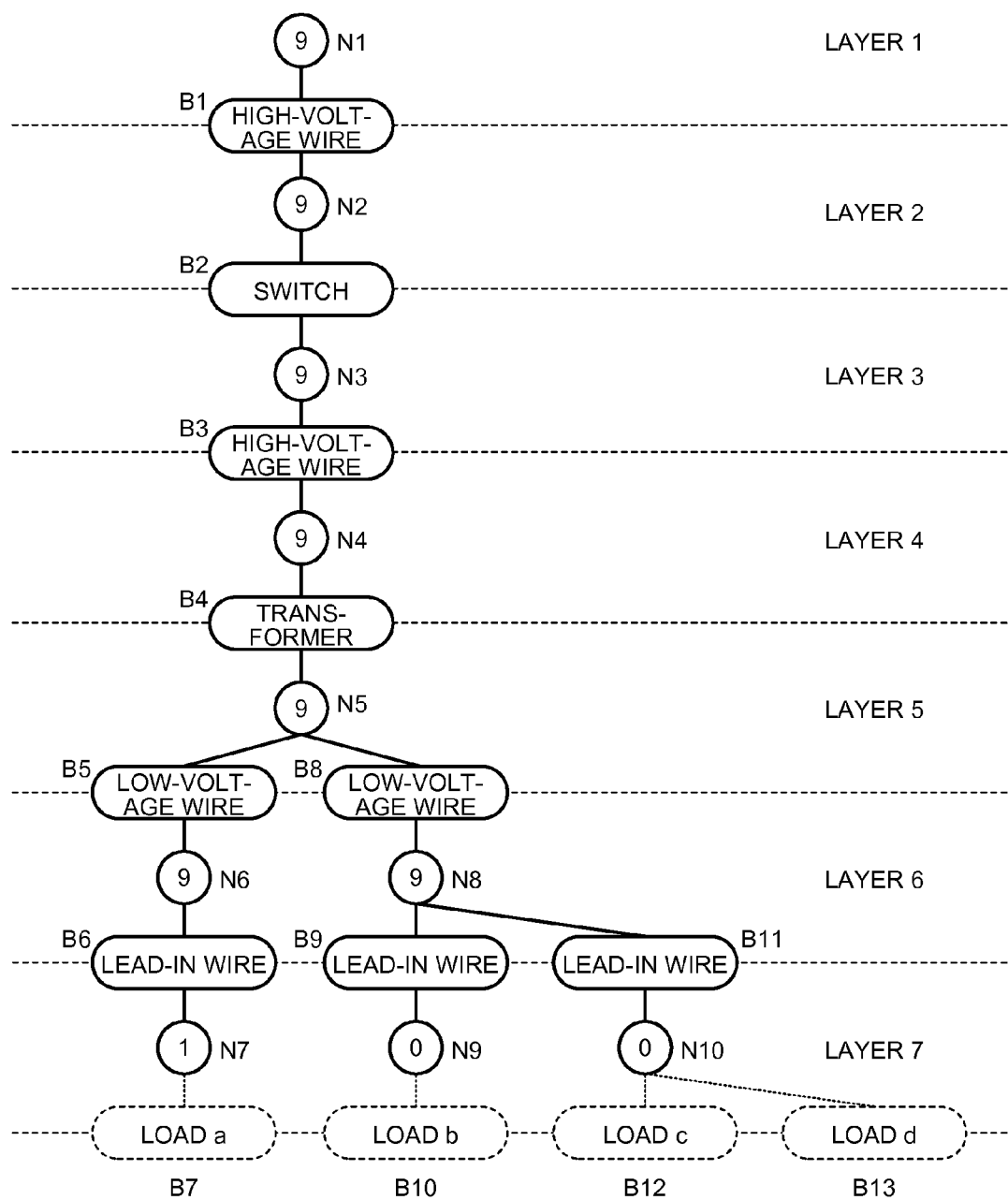
FIG. 17 is a diagram illustrating an example of the graph structure of the current system.

FIGS. 16 and 17 are diagrams illustrating an example of the graph structure of the current system. In FIGS. 16 and 17, there is denoted transition in setting of the energizing state in a case where the energizing state of the terminal node is determined using the current node illustrated in FIG. 14 and the current "branch" illustrated in FIG. 15. Among them, in FIG. 16, there is denoted a setting situation of the energizing state at a time point when the determination on the energizing state of the terminal node starts and all the current nodes are set to the "undefined" energizing state, and in FIG. 17, there is denoted a setting situation of the energizing state at a time point when the determination result is set to the energizing state of the terminal node. In addition, in FIGS. 16 and 17, the energizing state of the current node is denoted in each current node. In the following description, when the value of the energizing state set in the node is "1", it indicates "Connection", when the value is "0", it indicates "Blackout", and when the value is "9", it indicates "Undefined".

For example, the process is activated in a case (the meter reading interval after the detection of the abnormal "branch" at the last time+the transmission delay time) elapses, and as illustrated in FIG. 16, the energizing states of all the current nodes registered in the current node table 17a illustrated in FIG. 14 are set to "9 (Undefined)". Then, the current "branch" having the facility ID of the load facility connected to the smart meter 50 is searched from the current "branch" table 17b illustrated in FIG. 15. Referring to the example of the current "branch" illustrated in FIG. 15, there are searched four current "branches" (that is, the branch IDs "B7", "B10", "B12", and "B13") of the facility IDs "LL1", "LL2", "LL3", and "LL4" where the node IDs are not set on the secondary side. Four "branches" of the facility IDs "LL1", "LL2", "LL3", and "LL4" thus searched are registered in the investigation list.

Thereafter, one current "branch" is selected from the investigation list. At this time, a case where the facility ID "LL1" is selected will be assumed. For example, when the current time is 15:20:00, there is a record having the facility ID "LL1" in the load table 18a illustrated in FIG. 13, and the time "15:10:19" of the latest record falls within a predetermined time period (for example, within 30 minutes+1 minute) from the current time "15:20:00". Therefore, the node (that is, the energizing state of the terminal node "N7") of the "branch" of the facility ID "LL1" on the primary side is set to "1". On the other hand, in a case where the current "branches" of the facility IDs "LL2", "LL3", and "LL4" are selected, the time does not fall within the predetermined time period from the moment, so that the nodes (that is, the energizing states of the terminal nodes "N9" and "N10") of these "branches" on the primary side are set to "0". In this way, the energizing states of the terminal nodes are set to the state illustrated in FIG. 17.

Next, the determination on the connection node will be described. For example, when the determination on the energizing state of the terminal node is ended, the detection unit 19e searches the terminal node of which the energizing state is the connection state among the current nodes registered in the current node table 17a. Thereafter, the detection unit 19e registers the current node searched from the current node table 17a in the investigation list. Subsequently, the detection unit 19e selects one current node from the investigation list. Subsequently, the detection unit 19e searches the current "branch" having the current node on the secondary side previously selected among the current "branches" registered in the current "branch" table 17b.

Then, in a case where the current "branch" is searched from the current "branch" table 17b, the detection unit 19e searches the current node of the current "branch" on the primary side. At this time, in a case where the energizing state of the current node on the primary side is set to "Undefined", the detection unit 19e sets the energizing state of the current node on the primary side to "Connection", and additionally registers the current node on the primary side in the investigation list. Thereafter, until the uninvestigated current node disappears from the investigation list, the detection unit 19e repeatedly performs a process of investigating the connection node from the terminal node to the uppermost node of the SS bank.

Figure 18:
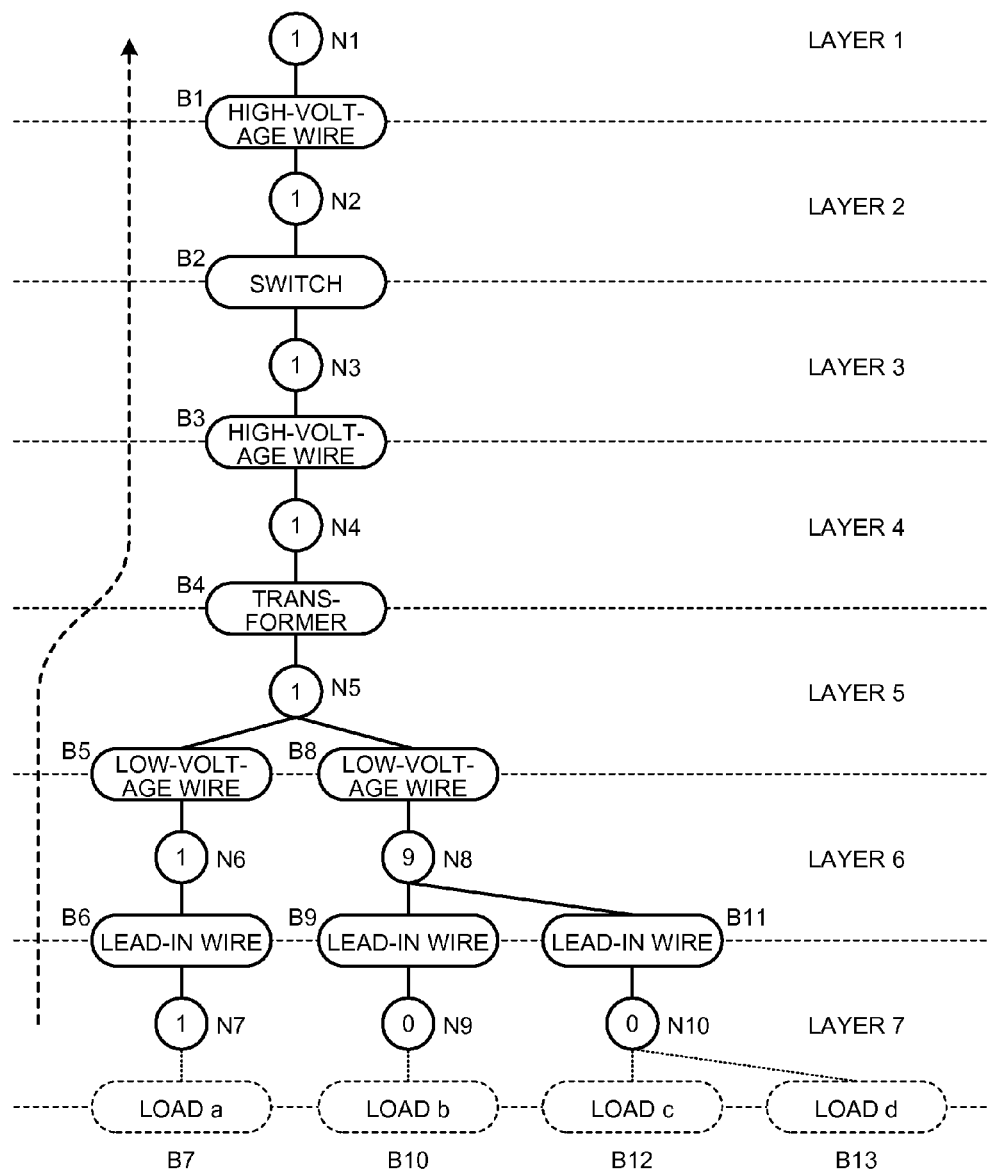
FIG. 18 is a diagram illustrating an example of the graph structure of the current system.

Herein, a specific example of the determination on the connection node will be described using FIGS. 17 and 18. FIG. 18 is a diagram illustrating an example of the graph structure of the current system. In FIG. 18, a setting situation of the energizing state at the time when the determination on the connection node is ended is illustrated. For example, after the determination on the energizing state of the terminal node is ended, only the terminal node (that is, the terminal node having the node ID "N7" illustrated in FIG. 17) of which the energizing state of the terminal node is set to "Connection" is investigated and then registered in the investigation list. In this case, since only the terminal node having the node ID "N7" is registered in the investigation list, the terminal node having the node ID "N7" is selected. Then, the current "branch" having the current node "N7" on the secondary side (the "span" having the facility ID "SP4" in the example illustrated in FIG. 15) is searched.

Then, the current node "N6" on the primary side of the current "branch" having the facility ID "SP4" is searched. At this time, since the energizing state of the current node "N6" on the primary side is set to "Undefined" as illustrated in FIG. 17, the energizing state of the current node "N6" on the primary side is set to "Connection", and the current node "N6" on the primary side is additionally registered in the investigation list. Thereafter, as a result of the process performed in such a flow, the current node "N6" is selected, the energizing state of the current node "N5" is set to "Connection", and the current node "N5" is additionally registered in the investigation list. Afterward, the investigation of the current node is performed in an order of "N5", "N4", "N3", "N2", and "N1" and thus the energizing states of the respective current nodes are set to "Connection". Then, when the investigation of the uppermost current node "N1" is ended, the uninvestigated current node disappears and the determination on the connection node is ended. As a result, the energizing states of the current nodes are updated to be the state illustrated in FIG. 18.

Next, the determination on the blackout node will be described. For example, when the determination on the connection node is ended, the detection unit 19e searches a terminal node of which the energizing state is set to "Blackout" among the current nodes registered in the current node table 17a. Thereafter, the detection unit 19e registers the current node (that is, the terminal node) searched from the current node table 17a in the investigation list. Subsequently, the detection unit 19e selects one current node from the investigation list. Subsequently, the detection unit 19e searches the current "branch" having the current node (on which the selection is previously performed) on the secondary side among the current "branches" additionally registered in the current "branch" table 17b.

Then, in a case where the current "branch" is searched from the current "branch" table 17b, the detection unit 19e searches the current node on the primary side of the current "branch" from the current node table 17a. At this time, in a case where the energizing state of the current node on the primary side is set to "Undefined", the detection unit 19e searches the current "branch" which has the current node having the "Undefined" energizing state on the primary side from among the current "branch" table 17b. Thereafter, the detection unit 19e registers the current "branch" searched from the current "branch" table 17b in the investigation list. Further, in a case where the energizing state of the current node on the primary side is not set to "Undefined", the energizing state of the current node on the primary side is set to be "Connection" or "Blackout" which is already known. In this case, the investigation from the terminal node is stopped.

Subsequently, the detection unit 19e selects one current "branch" from the investigation list. Then, the detection unit 19e searches the current node on the secondary side of the current "branch" on which the selection is previously performed from the current node table 17a. Then, the detection unit 19e determines whether the energizing state of the current node on the secondary side searched from the current node table 17a is a state other than "Connection". Thereafter, in a case where the energizing state of the current node on the secondary side is a state other than "Connection", the detection unit 19e selects one uninvestigated current "branch" from the investigation list, and repeatedly investigates the current nodes on the secondary side of all the current "branches" having the current node of which the energizing state is set to "Undefined" on the primary side.

Thereafter, in a case where the current node on the primary side is set to "Undefined" and the energizing states of all the current nodes on the secondary side are set to a state other than "Connection", the detection unit 19e sets the "Undefined" energizing state of the current node to the "Blackout" and additionally registers the current node in the investigation list. Then, the detection unit 19e repeatedly performs a process of investigating the blackout node from the terminal node to the uppermost node of the SS bank until the uninvestigated current node disappears from the investigation list.

Figure 19:
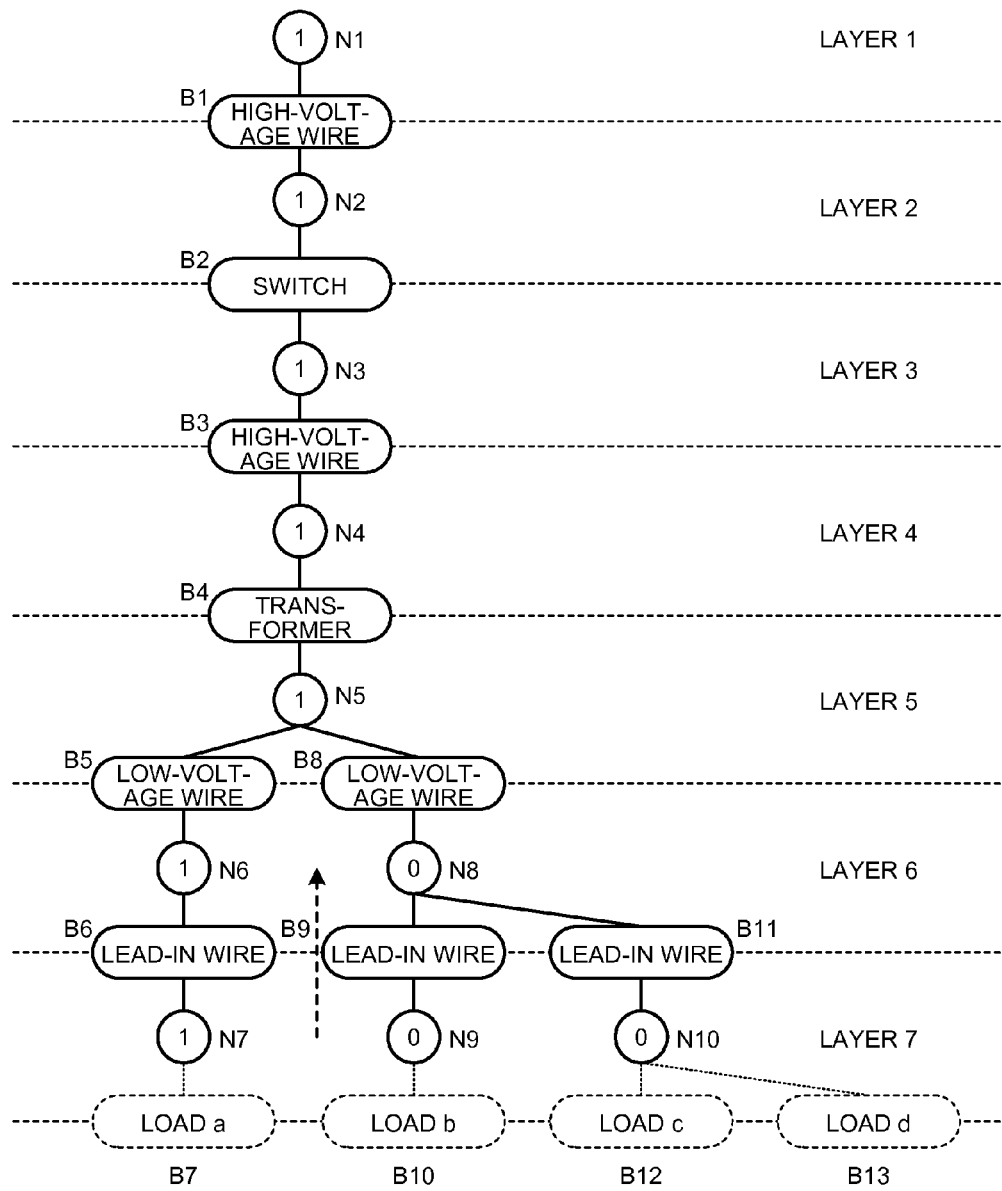
FIG. 19 is a diagram illustrating an example of the graph structure of the current system.

Herein, a specific example of the determination on the blackout node will be described using FIGS. 18 and 19. FIG. 19 is a diagram illustrating an example of the graph structure of the current system. In FIG. 19, a setting situation of the energizing state at the time when the determination on the blackout node is ended is illustrated. For example, after the determination on the connection node is ended, the terminal node (that is, the terminal nodes having the nodes ID "N9" and "N10" illustrated in FIG. 18) of which the energizing state is set to "Blackout" is searched and registered in the investigation list. Herein, as an example, a case where the terminal node having the node ID "N9" is selected will be considered. Then, the current "branch" "B9" having the current node "N9" on the secondary side is searched.

Then, the current node "N8" of the current "branch" "B9" on the primary side is searched. Since the energizing state of the current node "N8" is set to "Undefined", the current "branch" "B11" having the current node "N8" on the primary side is searched. The current node "N10" of which the energizing state is set to "Blackout" is connected to the current "branch" "B11". In other words, below the current node "N8", there is no current node of which the energizing state is a state other than "Blackout". In this case, the energizing state of the current node "N8" of which the energizing state is set to "Undefined" is updated to be "Blackout". As a result, the energizing state of the current node is updated to be the state illustrated in FIG. 19.

Next, the detection of the abnormal "branch" will be described. For example, when the determination on the blackout node is ended, the detection unit 19e searches the current node which has no primary side among the current nodes registered in the current node table 17a. Thereafter, the detection unit 19e registers the current node which is the uppermost node searched from the current node table 17a in the investigation list. Subsequently, the detection unit 19e selects one current node from the investigation list.

Then, the detection unit 19e searches the current "branch" having the current node on the primary side where the selection is previously performed from the current "branch" table 17b. Thereafter, the detection unit 19e registers the current "branch" searched from the current "branch" table 17b in the investigation list. Subsequently, the detection unit 19e selects one current "branch" from the investigation list.

Thereafter, the detection unit 19e further searches the current node on the secondary side of the current "branch" selected from the investigation list. Thereafter, the detection unit 19e determines whether the energizing state of the current node on the primary side of the current "branch" selected from the investigation list is "Connection", and the energizing state of the current node on the secondary side is "Blackout".

Herein, in a case where the energizing state of the current node on the primary side of the current "branch" is "Connection" and the energizing state of the current node on the secondary side is "Blackout", it is determined that the current "branch" is a "branch" having the connection node and the blackout node, and the current "branch" is disconnected. In this case, the detection unit 19e detects the current "branch" as an "abnormal "branch"".

On the other hand, even when the energizing state of the current node on the primary side of the current "branch" is "Connection", in a case where the energizing state on the secondary side of the current node is also "Connection", it can be seen that the current "branch" is not disconnected. In this case, the detection unit 19e additionally registers the current node on the secondary side of the current "branch" in the investigation list. Thereafter, until the uninvestigated current "branch" disappears from the investigation list, the detection unit 19e repeatedly determines whether there is the abnormal "branch" having the connection node and the blackout node and additionally registers the current node on the secondary side in the investigation list. Thereafter, when the uninvestigated current "branch" disappears from the investigation list, the detection unit 19e repeatedly selects the current node and determines whether there is the abnormal "branch" having the connection node and the blackout node until the uninvestigated current node disappears from the investigation list. Further, in a case where no abnormal "branch" having the connection node and the blackout node is detected, it can be seen that there is no abnormality in the facility of the electric power provider.

Herein, a specific example of detecting the abnormal "branch" will be described using FIG. 19. For example, after the determination on the blackout node is ended, the current node "N1" having no primary side is searched among the current nodes registered in the current node table 17a and the current node "N1" is registered in the investigation list. Subsequently, when the current node "N1" is selected from the investigation list, the current "branch" "B1" having the current node "N1" on the primary side is searched. Subsequently, the current node "N2" having the current "branch" "B1" on the secondary side is further searched.

At this time, since the energizing state of the current node "N1" on the primary side and the energizing state of the current node "N2" on the secondary side are "Connection" in the current "branch" "B1", it can be seen that the current "branch" "B1" is not disconnected. In this case, after the current node "N2" on the secondary side of the current "branch" is additionally registered in the investigation list, the detection unit 19e starts the investigation on the current node "N2". Thereafter, the investigation is performed in an order of the current nodes "N2", "N3", and "N4", and thus it can be seen that the current "branches" "B2", "B3" and "B4" are not disconnected. Then, in a case where the investigation on the current node "N2" is performed, two current "branches" "B5" and "B8" are searched.

Among them, in the current "branch" "B5", since the energizing state of the current node "N5" on the primary side and the energizing state of the current node "N6" on the secondary side both are "Connection", it can be seen that the connection is not released. On the other hand, in the current "branch" "B8", since the energizing state of the current node "N5" on the primary side is set to "1" and the energizing state of the current node "N8" on the secondary side is set to "0", it is determined that the current "branch" "B8" is disconnected. In this case, the current "branch" "B8" illustrated in FIG. 19 is detected as an abnormal "branch".

Returning to the description of FIG. 1, the display controller 19f is a processing unit which performs display control on the client terminal 30. As an aspect, the display controller 19f generates the display data of the power distribution system screen according to a display setting of a user and causes the client terminal 30 to display the display data of the power distribution system screen. Further, the description herein has been made about a case where the display data is displayed in the client terminal 30, but the display data may be displayed in a display unit of the power distribution management apparatus 10 or another apparatus.

In this regard, the display controller 19f is a processing unit which acquires the display setting of the screen to be displayed in the client terminal 30. For example, the display controller 19f can acquire display setting information (not illustrated) stored in the storage unit 13 in a case where the browse request for the power distribution system screen is received from the client terminal 30, in a case where a login process from the client terminal 30 to the power distribution management apparatus 10 is successfully performed, or in a case where a predetermined time period (for example, the meter reading interval "30 minutes"+the transmission delay time "α") elapses after the last update.

As an aspect of such display setting information, data associated with items such as a display range of the map, a map scale, and display representation. Among them, an example of the map display range includes an area in which a power distribution system having a high importance in the map display range or in the service area of the electric power provider at the time when the last power distribution system screen is browsed. Such a map range, for example, can be defined by an element such as a specific point on the power distribution system screen (for example, the left upper vertex or the center of the screen, the width and the height of the screen, and the like). In addition, as an example of the map scale, the map scale itself may be used, a level associated with a certain scale (for example, a "broad-area map" drawn on a scale smaller than a detailed map and a "detailed map" drawn on a scale larger than the broad-area map) may be used. In addition, as an example of the display representation, there are a voltage display representation in which the voltage of the low-voltage system is displayed and a blackout display representation in which an abnormal place of the power distribution system is displayed.

In addition, the display controller 19f can acquire the display setting by receiving the display setting of the power distribution system screen from the client terminal 30 instead of the acquisition of the display setting information (not illustrated) stored in the storage unit 13.

Figure 20:
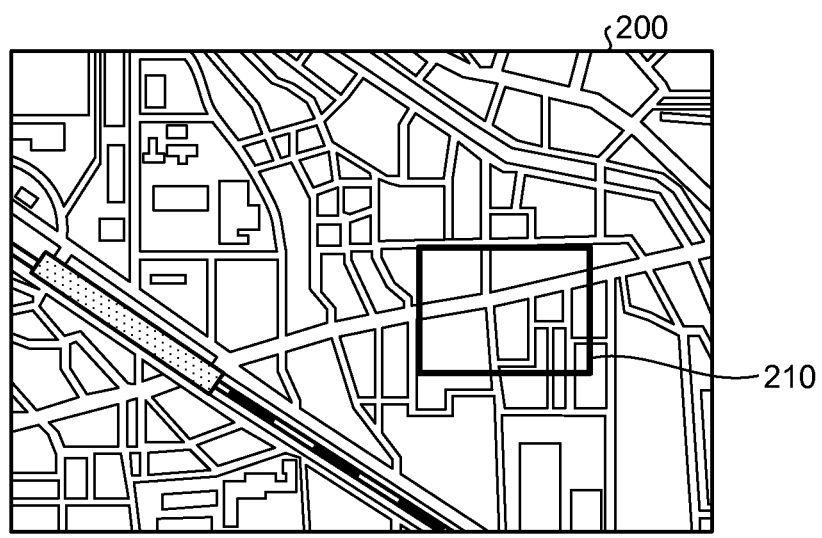
FIG. 20 is a diagram illustrating an example of a reception screen of a display setting.

FIG. 20 is a diagram illustrating an example of a reception screen of the display setting. In a reception screen 200 of the display setting illustrated in FIG. 20, there is illustrated an entire area map which contains the entire area managed by one electric power substation. In FIG. 20, in a case where the map scale is the "detailed map", there is illustrated a focusing box 210 which is used to set the display range of the power distribution system screen on the entire area map. In such a reception screen 200, the map scale can be freely switched to any of "detailed map" or "broad-area map" by operating a switching button (not illustrated) or the like. In addition, the map scale may be selected from a pull-down menu, or an arbitrary scale may be input from a form. In addition, the map display range displayed in the power distribution system screen can be set by moving the focusing box 210 to a predetermined position on the reception screen 200 illustrated in FIG. 20. Further, the reception screen 200 of the display setting may be temporarily displayed in a case where the browse request for the power distribution system screen is received, or may be normally displayed at a position different from a position at which the power distribution system screen is displayed in a window.

Subsequently, the display controller 19f acquires position IDs contained in the display range of the map from the "Location" table 14a. Then, the display controller 19f acquires the records of "units" and "spans" having the position IDs in the display range of the map from the "unit" table 15a and the "span" table 15b. Subsequently, the display controller 19f extracts a record of which the facility ID is recorded in the "branch" table 16b among the records of the "units" and the "spans". Therefore, a "unit" and a "span" contained in the current system are extracted even among the "units" and the "spans". Thereafter, the display controller 19f generates display data by disposing the respective facilities in a map image of the display range cut out of map information stored in the storage unit 13 using position information such as a longitude and a latitude corresponding to the position IDs of the facilities such as the "unit" and the "span" contained in the current system. Then, the display controller 19f determines whether the display representation of the display setting is a "voltage display representation".

Herein, in a case where the display representation is the "voltage display representation", the display controller 19f extracts a facility where the reverse power flow occurs (that is, a facility of which the voltage on the secondary side is higher than that on the primary side) among the facilities of the power distribution system with reference to a calculation result of a voltage of each current node calculated by the calculation unit 19d. Thereafter, the display controller 19f adds a symbol (for example, an arrow) indicating a direction of electricity flowing into the facility where the reverse power flow occurs to the display data of the "unit" and the "span" of the current system. Further, the description herein has been made about a case where the direction of electricity flowing into the facility where the reverse power flow occurs is displayed, but a display color of the facility where the reverse power flow occurs may be changed or the facility where the reverse power flow occurs may be displayed in a flickering manner to be distinguished from the others.

Furthermore, the display controller 19f sets the different display colors of the load facility and the power distribution system according to a voltage state of each current node. For example, a case where a standard voltage is "101 V" and the allowable range from the standard voltage "±6" will be assumed. In this example, the display controller 19f divides the voltages included in the allowable range from 95 V to 107 V by 1-V step, and sets different colors to the facilities according to the voltage values in the respective steps. Furthermore, the display controller 19f may set a display color to warn a facility having a voltage deviated from the allowable range (that a voltage exceeding the upper limit value "107 V" and a voltage lower than the lower limit value "95 V"). For example, the display controller 19f may set a display color of "red" to the facility having a voltage exceeding the upper limit value or sets a display color of "blue" to the facility exceeding the lower limit value. In this case, the respective steps included in the allowable range are set such that the display color is changed to approach "green" as the voltage approaches the standard voltage "101 V". Therefore, the facility having a voltage near the upper limit value and the facility having a voltage near the lower limit value can be intuitively recognized. Further, the description herein has been made about a case where the standard voltage is 101 V, but the same display control can be performed even in a case where the standard voltage is set to a different value.

Figure 21:
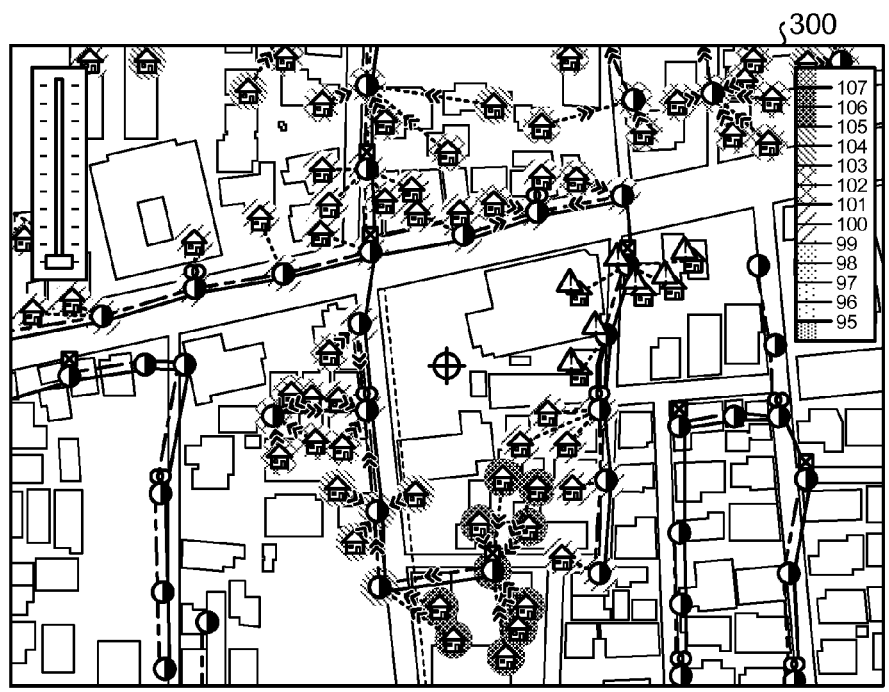
FIG. 21 is a diagram illustrating an example of a power distribution system screen.

FIG. 21 is a diagram illustrating an example of the power distribution system screen. In FIG. 21, the display data of a power distribution system screen 300 in the voltage display representation is illustrated. As illustrated in FIG. 21, arrows indicating the directions of electricity flowing to the facilities were the reverse power flow occurs are indicated in the power distribution system screen 300. Therefore, a member who browses the power distribution system screen 300 as the electric power provider can intuitively ascertain the "unit" or the "span" of which the voltage becomes high due to the reverse power flow. Furthermore, as illustrated in FIG. 21, the display colors of the "unit" and the "span" are assigned to the power distribution system screen 300 such that the color approaches red as the voltage is increased and approaches blue as the voltage is decreased with green indicating the standard voltage "101 V" as the center. Therefore, it is possible to plan for the facility indicated with a color near 95 V (the lower limit value) about a countermeasure against a voltage drop due to a construction work for increasing the size of the low-voltage wire or the lead-in wire or against an decrease of a voltage ratio occurring when a transformer tap is adjusted from a high voltage to a low voltage in a construction work. In addition, it is possible to plan for the facility indicated with a color near 107 V (the upper limit value) about a countermeasure against an increase of the voltage ratio occurring when the transformer tap is adjusted from a high voltage to a low voltage in the construction work. Furthermore, in a case where the arrows are indicated and illustrated by green or blue, and when the power is not generated by the load facility, it is possible to ascertain that the facility is likely to have the voltage lower than the allowable range. Even in this case, it is possible to plan for a countermeasure such as the construction work for the wire or the construction work for the transformer tap adjustment. It is also possible to display a warning against the facility which is attached with the arrow and shown by a color near blue after extracting the facility ID.

In addition, in a case where the display representation is the "blackout display representation", the display controller 19f changes a display representation of the abnormal "branch" detected by the detection unit 19e. Furthermore, the display controller 19f may change the display representation of the load facility contained in the abnormal "branch" to another display representation as a blackout range where the blackout occurs due to the abnormal "branch". For example, the display controller 19f can display the facility where the blackout occurs in a flickering manner or in a different color to distinguish the display representation from the other facilities where the blackout does not occur.

Figure 22:
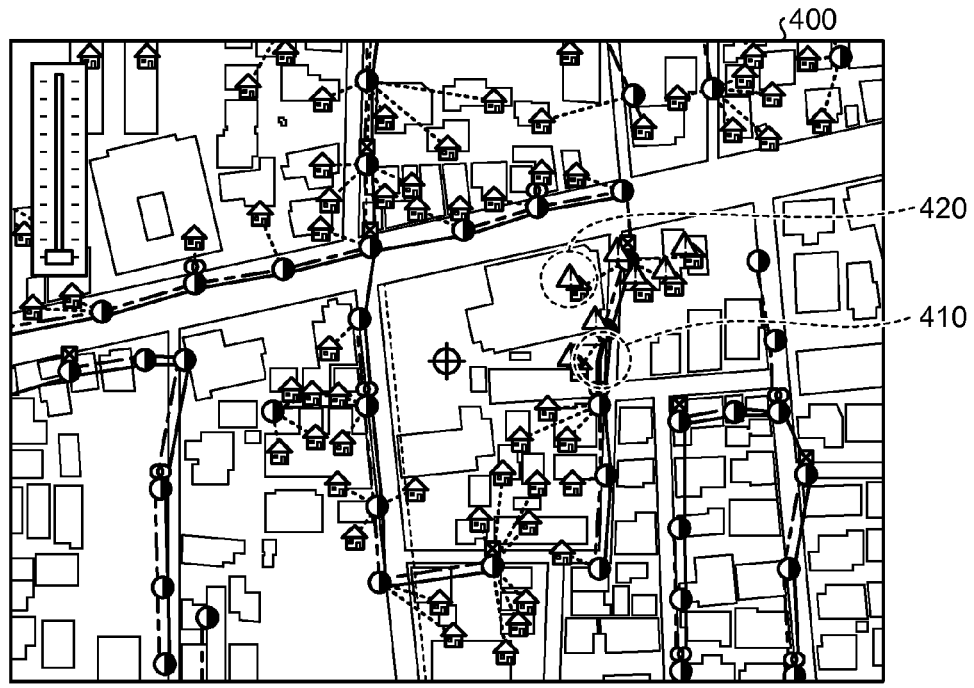
FIG. 22 is a diagram illustrating an example of the power distribution system screen.

FIG. 22 is a diagram illustrating an example of the power distribution system screen. In FIG. 22, the display data of a power distribution system screen 400 in the blackout display representation is illustrated. As illustrated in FIG. 22, a "span" 410 detected as the abnormal "branch" is displayed in a color different from the other facilities in the power distribution system screen 400. Therefore, the member who browses the power distribution system screen 400 as the electric power provider can ascertain that the "span" 410 is an abnormal place. Furthermore, as illustrated in FIG. 22, in the power distribution system screen 400, "!" is indicated in a vicinity of a load facility 420 in an influence range due to the abnormality of the "span" 410. Therefore, the member of the electric power provider can ascertain that the blackout occurs in the load facility attached with "!" due to the abnormality generated in the "span" 410.

Further, the description herein has been made about a case where the power distribution system screen displayed in the voltage display representation and the power distribution system screen displayed in the blackout display representation are exclusively displayed, but it is also possible to generate the display data of the power distribution system screen by performing the display control by combining two display representations. In addition, the voltage display representation and the blackout display representation can be switched therebetween at an arbitrary timing, and can be switched under an arbitrary condition. For example, the power distribution system screen in the voltage display representation and the power distribution system screen in the blackout display representation may be displayed by being switched with an interval therebetween, or may be displayed by receiving a switching request through a GUI (Graphical User Interface).

Further, the controller 19 may employ various integrated circuits or electronic circuits. In addition, some of the functional units of the controller 19 may be configured by other integrated circuits or electronic circuits. For example, as the integrated circuit, an ASIC (Application Specific Integrated Circuit) may be used. In addition, as the electronic circuit, a CPU (Central Processing Unit) or an MPU (Micro Processing Unit) may be used.

[Flow of Processes]

Subsequently, a flow of processes performed by the power distribution management apparatus 10 according to the embodiment will be described. Further, herein, after (1) a power distribution management process performed by the power distribution management apparatus 10 is described, the description will be made about (2) the display control process of the power distribution system screen.

(1) Power Distribution Management Process

Figure 23:
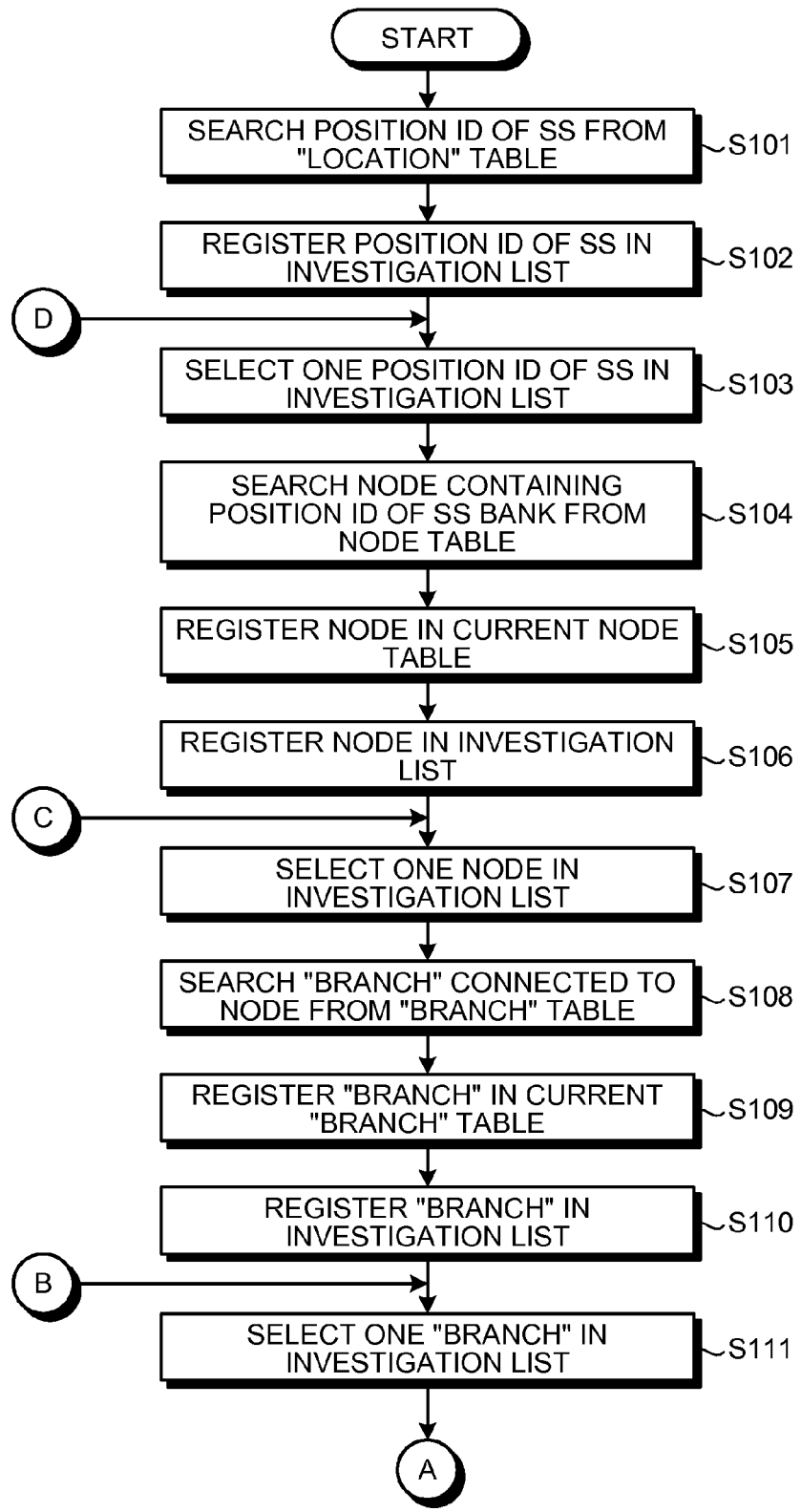
FIG. 23 is a flowchart (1) illustrating a power distribution management process according to a first embodiment.
Figure 24:
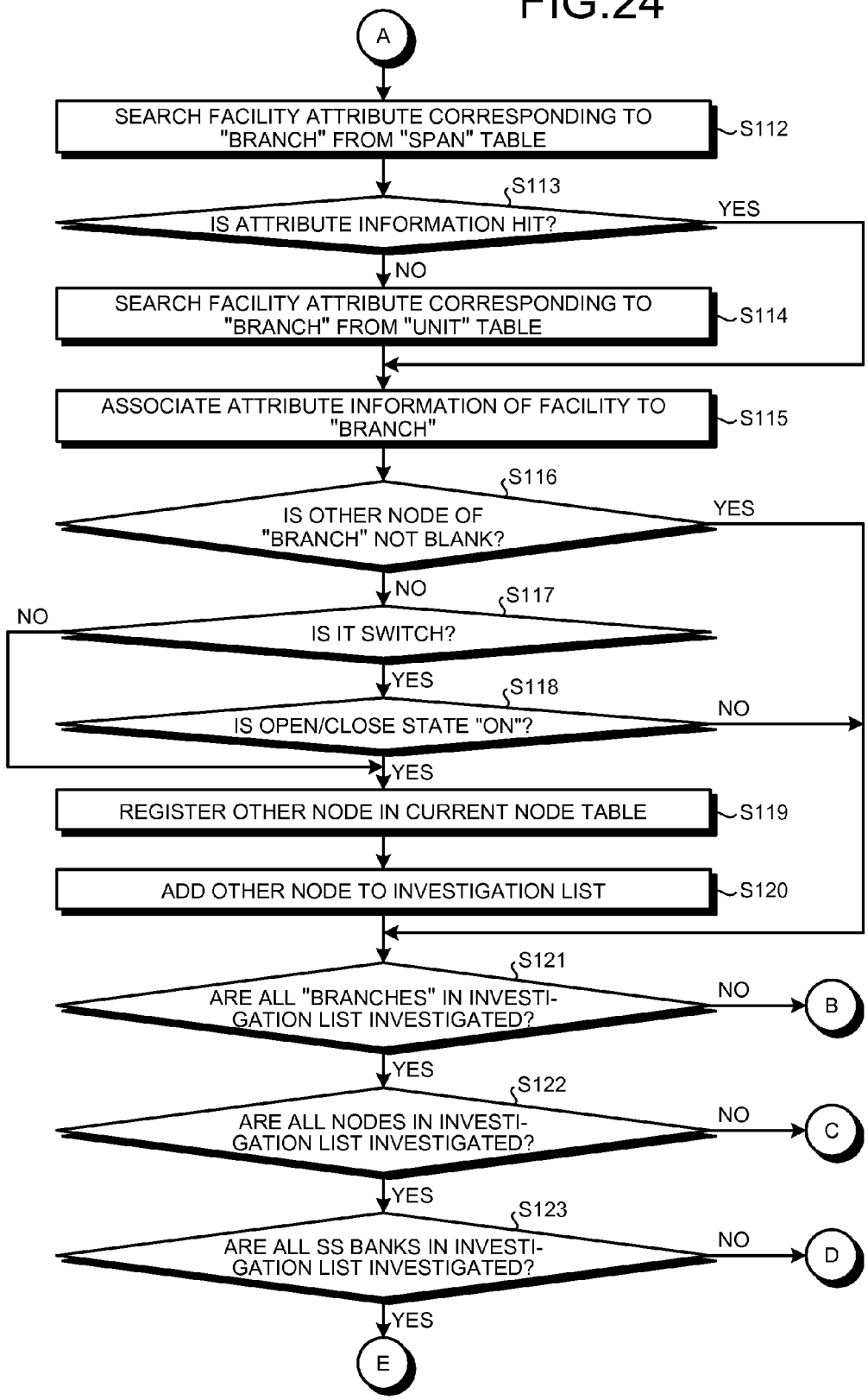
FIG. 24 is a flowchart (2) illustrating the power distribution management process according to the first embodiment.
Figure 25:
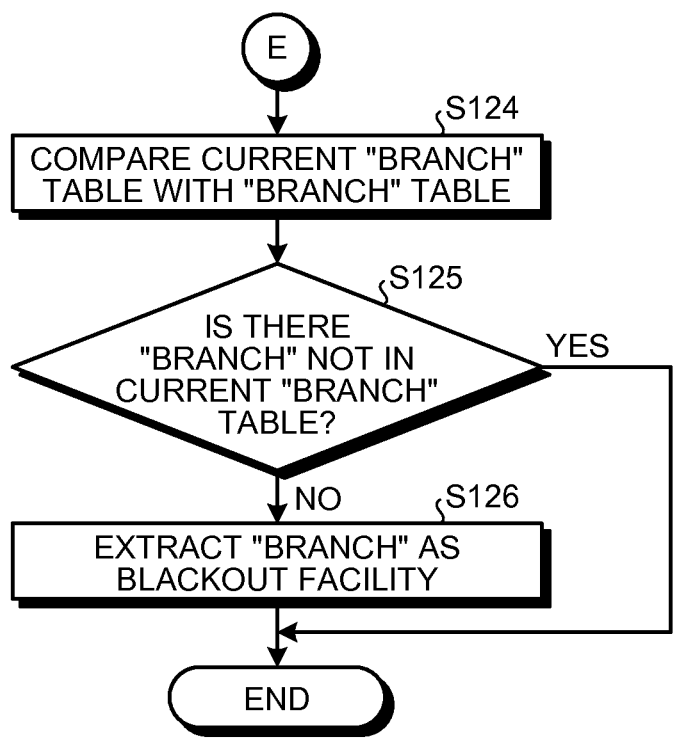
FIG. 25 is a flowchart (3) illustrating the power distribution management process according to the first embodiment.

FIGS. 23 to 25 are flowcharts illustrating a power distribution management process according to the first embodiment. The power distribution management process starts in a case where the browse request for the power distribution system screen is received through the client terminal 30, or in a case were a certain time period elapses after the last process.

As illustrated in FIG. 23, the search unit 19a searches the position ID of which the position type is the power distribution substation "SS" among the position IDs stored in the "Location" table 14a (Step S101). Then, the search unit 19a registers the position ID of the power distribution substation SS searched from the "Location" table 14a to the investigation list (Step S102).

Subsequently, the search unit 19a selects one position ID of the power distribution substation SS registered in the investigation list (Step S103). Then, the search unit 19a searches a node corresponding to the position ID of the power distribution substation SS to which the selection is previously performed among the nodes stored in the node table 16a (Step S104).

Furthermore, the search unit 19a registers the record of the node searched from the node table 16a in the current node table 17a which is stored as the power distribution system information 17 in the storage unit 13 (Step S105).

Furthermore, the search unit 19a registers the node searched from the node table 16a in the investigation list (Step S106).

Then, the search unit 19a selects one node registered in the investigation list (Step S107). Subsequently, the search unit 19a searches the record of the "branch" having a combination of the node IDs containing the node selected in Step S107 (that is, a combination of the node $ID_1$ and the node ID) among the "branches" stored in the "branch" table 16b (Step S108).

Furthermore, the search unit 19a registers the record of the "branch" searched in Step S106 in the current "branch" table 17b (Step S109). Furthermore, the search unit 19a registers the "branch" searched in Step S108 in the investigation list (Step S110). Subsequently, the search unit 19a selects one "branch" registered in the investigation list (Step S111).

Then, as illustrated in FIG. 24, the search unit 19a searches the attribute information corresponding to the facility ID of the "branch" selected in Step S111 from the "span" table 15b (Step S112). At this time, in a case where the attribute information is not possible to be searched from the "span" table 15b (that is, a case where the attribute information it not hit) (No in Step S113), the search unit 19a performs the following process.

In other words, the search unit 19a searches the attribute information corresponding to the facility ID of the "branch" selected from the "unit" table 15a in Step S111 (Step S114). Further, in a case where the attribute information is possible to be searched from the "span" table 15b (Yes in Step S113), the procedure skips the process of Step S114 and moves to the process of Step S115.

Then, the association unit 19b registers the attribute information of the "branch" in association with the record of the subject "branch" used in the search of the "span" table 15b or the "unit" table 15a among the records stored in the current "branch" table 17b (Step S115).

Thereafter, the search unit 19a determines whether the other node paring with the node investigated in Step S108 among the combinations of the nodes containing the "branch" searched in Step S108 is a blank (Step S116).

At this time, in a case where the other node is not a blank (No in Step S116), the search unit 19a further determines whether the subject "branch" is a switch (Step S117). Then, in a case where the "branch" is a switch (Yes in Step S117), the search unit 19a further determines whether the switch is in the close state (that is, whether the switch is in the ON state) (Step S118).

Herein, in a case where the switch is the ON state (Yes in Step S118), the search unit 19a searches the record of the other node from the node table 16a and then registers the other node in the current node table 17a of the power distribution system information 17 (Step S119). Furthermore, the search unit 19a adds the other node to the investigation list as the uninvestigated node (Step S120).

In addition, even in a case where the "branch" is not a switch (No in Step S117), the search unit 19a searches the record of the other node from the node table 16a and then registers the other node in the current node table 17a of the power distribution system information 17 (Step S119). Furthermore, the search unit 19a adds the other node to the investigation list as the uninvestigated node (Step S120).

On the other hand, in a case where the other node is a blank or in a case where the switch is in the OFF state (Yes in Step S116 or No in Step S118), the procedure proceeds to the process of Step S121.

Thereafter, the search unit 19a determines whether all the "branches" registered in the investigation list are investigated (Step S121). At this time, in a case where some of the "branches" registered in the investigation list are not investigated (No in Step S121), the uninvestigated "branch" is selected (Step S111) and then the processes from Step S112 to Step S120 are repeatedly performed.

Then, when all the "branches" registered in the investigation list are investigated (Yes in Step S121), the search unit 19a determines whether all the nodes registered in the investigation list are investigated (Step S122). At this time, in a case where some of the nodes registered in the investigation list are not investigated (No in Step S122), the uninvestigated node is selected (Step S107) and then the processes from Step S108 to Step S121 are repeatedly performed.

Thereafter, when all the nodes registered in the investigation list are investigated (Yes in Step S122), the search unit 19a determines whether all the position IDs of the power distribution substations SS registered in the investigation list are investigated (Step S123). At this time, in a case where some of the position IDs of the power distribution substations SS registered in the investigation list are not investigated (No in Step S123), the position ID of the uninvestigated power distribution substation SS is selected (Step S103) and then the processes from Step S104 to Step S122 are repeatedly performed.

Then, in a case where all the position IDs of the power distribution substations SS registered in the investigation list are investigated (Yes in Step S123), as illustrated in FIG. 25, the search unit 19a compares the record of the "branch" stored in the "branch" table 16b and the record of the "branch" stored in the current "branch" table 17b (Step S124).

Herein, in a case where the "branch" table 16b includes a record of the branch not matched with the current "branch" table 17b (No in Step S125), the search unit 19a detects the facility of the facility ID contained in the record of the subject "branch" as a blackout place (Step S126), and the process is ended. On the other hand, in a case where the "branch" table 16b has no record of the "branch" not matched with the current "branch" table 17b (Yes in Step S125), the process is ended without any action.

(2) Display Control Process of Power Distribution System Screen

Figure 26:
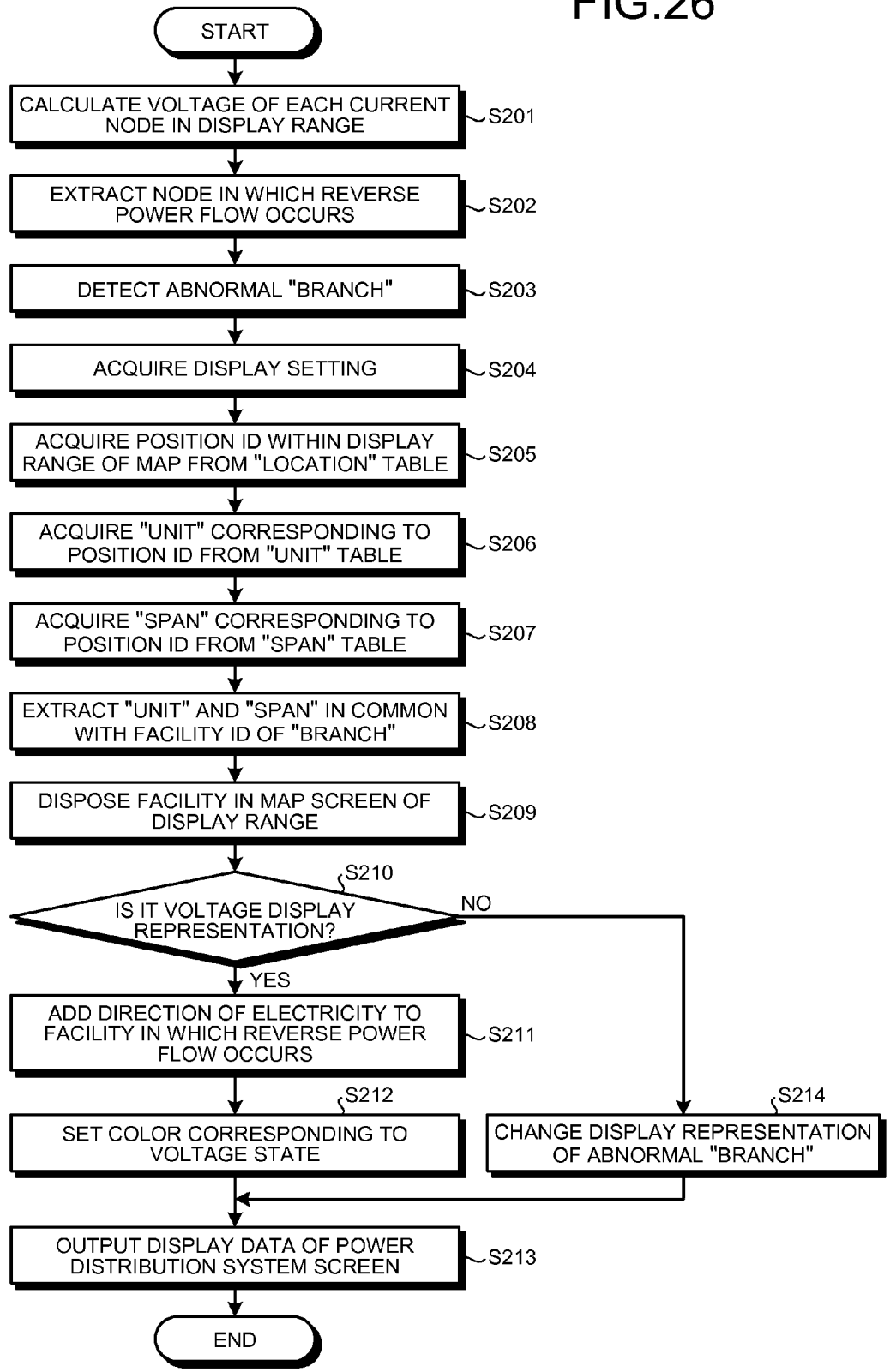
FIG. 26 is a flowchart illustrating a display control process of the power distribution system screen according to the first embodiment.

FIG. 26 is a flowchart illustrating the display control process of the power distribution system screen according to the first embodiment. The display control process is performed in a case where the browse request for the power distribution system screen is received from the client terminal 30, in a case where a login process from the client terminal 30 to the power distribution management apparatus 10 is successfully performed, or in a case where a predetermined time period elapses after the last update.

As illustrated in FIG. 26, the calculation unit 19d calculates a voltage of each current node from the current node of the substation to the current node of the load facility of each power distribution system using the load table 18a (Step S201).

Then, the display controller 19f extracts a facility where the reverse power flow occurs (that is, a facility of which the voltage on the secondary side is higher than that on the primary side) among the facilities of the power distribution system (Step S202) with reference to the calculation result of the voltage calculated in Step S201. Subsequently, the detection unit 19e detects a "branch" where an abnormality such as an accident or a failure occurs using the load table 18a (Step S203).

Thereafter, the display controller 19f acquires the display setting of the power distribution system screen to be displayed in the client terminal 30 (Step S204). Subsequently, the display controller 19f acquires the position ID included in the display range of the map from the "Location" table 14a (Step S205).

Then, the display controller 19f acquires a record of the "unit" having the position ID included in the display range of the map from the "unit" table 15a, and acquires a record of the "span" having the position ID included in the display range of the map from the "span" table 15b (Step S206 and Step S207).

Subsequently, the display controller 19f extracts a record of which the facility ID is registered in the "branch" table 16b among the records of the "units" and the "spans" (Step S208). Therefore, a "unit" and a "span" contained in the current system are extracted even among the "units" and the "spans".

Thereafter, the display controller 19f generates display data by disposing the respective facilities in a map image of the display range cut out of map information stored in the storage unit 13 using the position information such as the longitude and the latitude corresponding to the position IDs of the facilities such as the "unit" and the "span" contained in the current system (Step S209).

Herein, in a case where the display representation is the "voltage display representation" (Yes in Step S210), the display controller 19f adds a symbol indicating a flow direction of electricity to the facility which is extracted in Step S202 and in which the reverse power flow occurs among the "units" and the "spans" of the current system (Step S211). Then, the display controller 19f sets the different display colors of the load facility and the facility of the current power distribution system according to the voltage state of each current node (Step S212). Thereafter, the display controller 19f outputs the display data of the power distribution system screen on which the processes of Step S211 and Step S212 are performed to the client terminal 30 (Step S213), and the process is ended.

On the other hand, in a case where the display representation is the "blackout display representation" (No in Step S210), the display controller 19f changes the display representation of the blackout range containing the abnormal "branch" and the load facility connected to the abnormal "branch" detected in Step S203 (Step S214). Thereafter, the display controller 19f outputs the display data of the power distribution system screen on which the process of Step S214 is performed to the client terminal 30 (Step S213), and the process is ended.

Effects of First Embodiment

As described above, in a case where a facility of the power distribution system is displayed, the power distribution management apparatus 10 according to the embodiment displays information of the facility where the reverse power flow occurs from the load facility of the customer toward the facility of the power distribution system to be distinguished from the other facilities in the display representation. For this reason, in the power distribution management apparatus 10 according to the embodiment, it is possible to plan for the facility where the reverse power flow occurs about the construction work for the wire or the construction work for the transformer tap adjustment in consideration of the voltage variation due to the reverse power flow. Therefore, with the power distribution management apparatus 10 according to the embodiment, it is possible to suppress the flow of power exceeding the allowable range of the voltage in the power distribution system.

Second Embodiment

Hitherto, the embodiment of the disclosed apparatus has been described, but the invention may be implemented in various different forms other than the embodiment described above. In the following, another embodiment belonging to the invention will be described.

[Distribution and Integration]

In addition, the respective depicted components are not always configured as physically illustrated in the drawings. In other words, a specific pattern of distribution and integration of the respective apparatuses is not limited to the pattern illustrated in the drawing, but some or all of them may be mechanically or physically distributed/integrated in an arbitrary unit according to various loads or usage conditions. For example, the search unit 19a, the association unit 19b, the acquisition unit 19c, the calculation unit 19d, the detection unit 19e, or the display controller 19f may be provided as an external apparatus of the power distribution management apparatus 10 to be connected through a network. In addition, the search unit 19a, the association unit 19b, the acquisition unit 19c, the calculation unit 19d, the detection unit 19e, or the display controller 19f may be provided in an individual apparatus, and the function of the power distribution management apparatus 10 may be realized by connecting these apparatuses through the network to operate in cooperation with each other.

[Display Control Program]

In addition, the various types of processes described in the above embodiment may be realized by executing a program prepared beforehand using a computer such as a personal computer or a workstation. In the following, using FIG. 27, an example of the computer which executes the display control program having the same functions as the above embodiment will be described.

Figure 27:
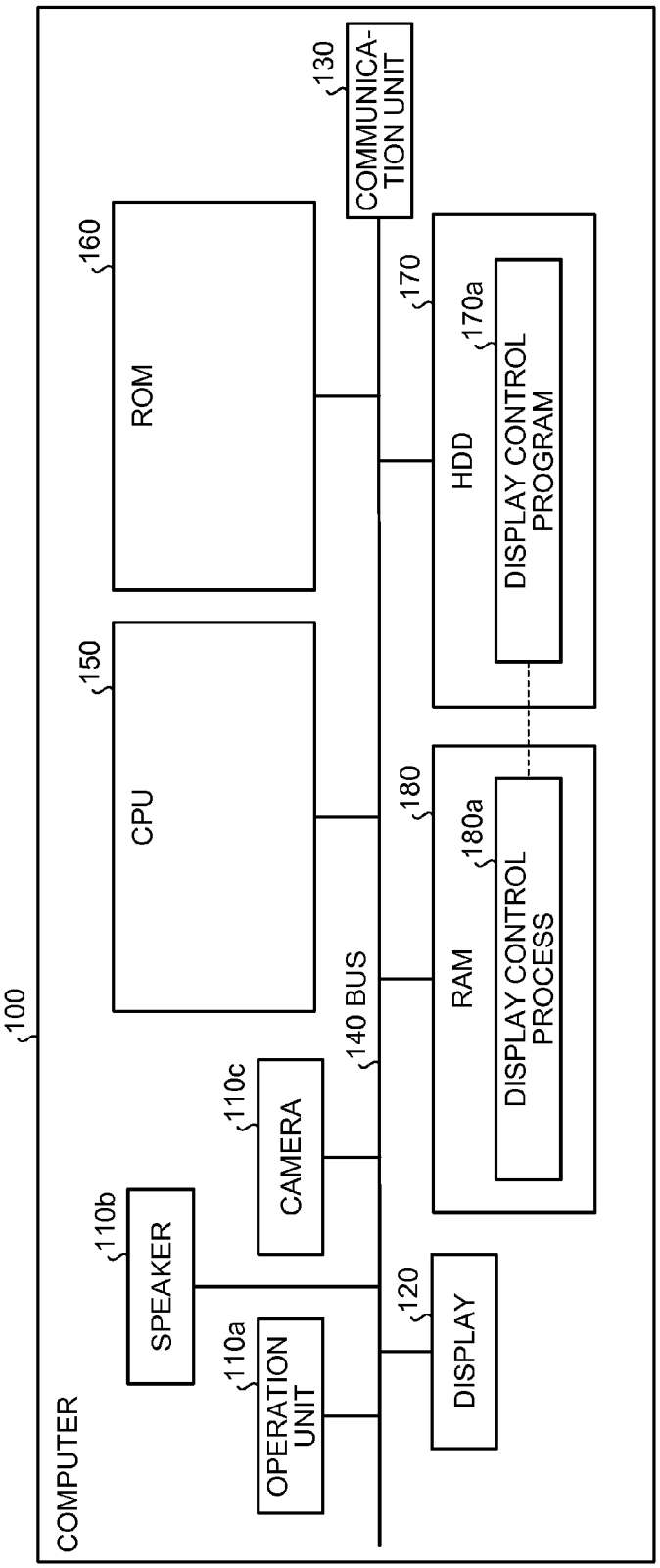
FIG. 27 is a diagram for describing an example of a computer which executes a display control program according to the first embodiment and a second embodiment.

FIG. 27 is a diagram for describing an example of the computer which executes the display control program according to the first embodiment and the second embodiment. As illustrated in FIG. 27, a computer 100 includes an operation unit 110a, a speaker 110b, a camera 110c, a display 120, and a communication unit 130. Furthermore, the computer 100 includes a CPU 150, ROM 160, an HDD 170, and RAM 180. These components 110 to 180 are connected to each other through a bus 140.

As illustrated in FIG. 27, a display control program 170a which performs the same functions as the search unit 19a, the association unit 19b, the acquisition unit 19c, the calculation unit 19d, the detection unit 19e, and the display controller 19f illustrated in the first embodiment is stored in the HDD 170 beforehand. The display control program 170a may be appropriately integrated or divided similarly to the respective elements of the search unit 19a, the association unit 19b, the acquisition unit 19c, the calculation unit 19d, the detection unit 19e, and the display controller 19f illustrated in FIG. 1. In other words, all the data to be stored in the HDD 170 is not necessarily stored in the HDD 170, and only data for the process may be stored in the HDD 170.

Then, the CPU 150 reads the display control program 170a out of the HDD 170 and develops the program in the RAM 180. Therefore, as illustrated in FIG. 27, the display control program 170a functions as a display control process 180a. The display control process 180a develops various types of data read out of the HDD 170 in an area appropriately allocated for its own sake on the RAM 180, and performs various types of processes based on the various types of developed data. Further, the display control process 180*a* includes the processes (for example, the processes illustrated in FIGS. 23 to 26) performed by the search unit 19*a*, the association unit 19*b*, the acquisition unit 19*c*, the calculation unit 19*d*, the detection unit 19*e*, and the display controller 19*f* illustrated in FIG. 1. In addition, all the respective processing units virtually realized on the CPU 150 are always not operated on the CPU 150, and only the processing units for the process may be virtually realized.

Further, the display control program 170*a* is not necessary to be stored in the HDD 170 or the ROM 160 from the beginning. For example, the respective programs may be stored in a "portable physical medium" (what is called an FD, a CD-ROM, a DVD disk, a magneto-optical disk, an IC card, and the like) of a flexible disk inserted in the computer 100. Then, the computer 100 may acquire the respective programs from the portable physical mediums and execute the programs. In addition, the respective programs are stored in another computer or a server apparatus connected to the computer 100 through a public line, the Internet, a LAN, a WAN, and the like, and the computer 100 may acquire and execute these programs.

According to an embodiment, it is possible to suppress that power exceeding an allowable voltage range in a power distribution system flows.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A power distribution management apparatus comprising:
 a processor that executes a process comprising:
  acquiring a measurement result from a meter connected to a customer's load facility which receives a distributed power from a power distribution system; and
  using different display representation to display a facility where electricity flows from the load facility toward a facility of the power distribution system among facilities of the load facility and the facility of the power distribution system to be distinguished from a facility where electricity flows from the facility of the power distribution system toward the load facility utilizing the measurement result of the meter.

2. The power distribution management apparatus according to claim 1, wherein the process further comprises:
 calculating a voltage at a junction where the respective facilities are connected utilizing the measurement result of the meter, wherein
 the using includes using the different display representation to display the load facility or the facility of the power distribution system by being distinguished according to a voltage state of each junction.

3. The power distribution management apparatus according to claim 2, wherein
 the using includes using the different display representation to display a facility having a junction of which the voltage deviated from a predetermined allowable range is calculated by being distinguished from the other facilities, the voltages at junctions of the other facilities being not deviated from the allowable range.

4. The power distribution management apparatus according to claim 3, wherein
 the using includes displaying a warning of the load facility or the facility of the power distribution system where the electricity flows from the load facility toward the facility of the power distribution system among the facilities having a junction of which the voltage within the allowable range is calculated.

5. The power distribution management apparatus according to claim 1, wherein the process further comprises:
 detecting the load facility or the facility of the power distribution system utilizing the measurement result of the meter, an abnormality occurring in the facility, wherein
 the using includes using the different display representation to display a facility having a detected abnormality by being distinguished from a facility having no detected abnormality.

6. The power distribution management apparatus according to claim 1, wherein
 the using includes displaying the facility of the power distribution system and the load facility at a position on a map which corresponds to the facility of the power distribution system or the load facility with reference to position information in which a position is associated with the facility of the power distribution system or the load facility.

7. A display control method comprising:
 acquiring, using a processor, a measurement result from a meter connected to a customer's load facility which receives a distributed power from a power distribution system; and
 using different display representation to display, using the processor, a facility where electricity flows from the load facility toward a facility of the power distribution system among facilities of the load facility and the facility of the power distribution system to be distinguished from a facility where electricity flows from the facility of the power distribution system toward the load facility utilizing the measurement result of the meter.

8. The display control method according to claim 7, further comprising:
 calculating a voltage at a junction where the respective facilities are connected utilizing the measurement result of the meter, wherein
 the using includes using the different display representation to display the load facility or the facility of the power distribution system by being distinguished according to a voltage state of each junction.

9. The display control method according to claim 8, wherein
 the using includes using the different display representation to display a facility having a junction of which the voltage deviated from a predetermined allowable range is calculated by being distinguished from the other facilities, the voltages at junctions of the other facilities being not deviated from the allowable range.

10. The display control method according to claim 9, wherein
 the using includes displaying a warning of the load facility or the facility of the power distribution system where the electricity flows from the load facility toward the facility of the power distribution system among the facilities having a junction of which the voltage within the allowable range is calculated.

11. The display control method according to claim 7, further comprising:
  detecting the load facility or the facility of the power distribution system utilizing the measurement result of the meter, an abnormality occurring in the facility, wherein
  the using includes using the different display representation to display a facility having a detected abnormality by being distinguished from a facility having no detected abnormality.

12. The display control method according to claim 7, wherein
  the using includes displaying the facility of the power distribution system and the load facility at a position on a map which corresponds to the facility of the power distribution system or the load facility with reference to position information in which a position is associated with the facility of the power distribution system or the load facility.

13. A non-transitory computer readable recording medium having stored therein a display control program that causes a computer to execute a process comprising:
  acquiring a measurement result from a meter connected to a customer's load facility which receives a distributed power from a power distribution system; and
  using different display representation to display a facility where electricity flows from the load facility toward a facility of the power distribution system among facilities of the load facility and the facility of the power distribution system to be distinguished from a facility where electricity flows from the facility of the power distribution system toward the load facility utilizing the measurement result of the meter.

14. The non-transitory computer readable recording medium according to claim 13, wherein the process further comprises:
  calculating a voltage at a junction where the respective facilities are connected utilizing the measurement result of the meter, wherein
  the using includes using the different display representation to display the load facility or the facility of the power distribution system by being distinguished according to a voltage state of each junction.

15. The non-transitory computer readable recording medium according to claim 13, wherein the process further comprises:
  detecting the load facility or the facility of the power distribution system utilizing the measurement result of the meter, an abnormality occurring in the facility, wherein
  the using includes using the different display representation to display a facility having a detected abnormality by being distinguished from a facility having no detected abnormality.

* * * * *